(12) United States Patent
Kibune

(10) Patent No.: US 8,588,359 B2
(45) Date of Patent: Nov. 19, 2013

(54) RECEPTION CIRCUIT, RECEPTION METHOD, AND SIGNAL TRANSFER SYSTEM

(75) Inventor: Masaya Kibune, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 487 days.

(21) Appl. No.: 12/757,790

(22) Filed: Apr. 9, 2010

(65) Prior Publication Data

US 2010/0226421 A1 Sep. 9, 2010

Related U.S. Application Data

(63) Continuation of application No. PCT/JP2007/069849, filed on Oct. 11, 2007.

(51) Int. Cl.
*H03D 3/24* (2006.01)
*H03L 7/00* (2006.01)

(52) U.S. Cl.
USPC .............................................. 375/376; 331/11

(58) Field of Classification Search
USPC ........................ 375/376; 331/11, 17
See application file for complete search history.

(56) References Cited

U.S. PATENT DOCUMENTS

| | | | | |
|---|---|---|---|---|
| 5,001,482 A | * | 3/1991 | Chung et al. | 341/136 |
| 5,999,511 A | * | 12/1999 | Jeon | 369/124.13 |
| 6,069,899 A | * | 5/2000 | Foley | 370/494 |
| 7,224,298 B2 | * | 5/2007 | Lin | 341/120 |
| 7,965,215 B2 | * | 6/2011 | Rofougaran | 341/155 |
| 2002/0012152 A1 | * | 1/2002 | Agazzi et al. | 359/189 |
| 2002/0172112 A1 | * | 11/2002 | Shoji et al. | 369/47.35 |
| 2004/0247024 A1 | * | 12/2004 | Gao et al. | 375/222 |
| 2006/0120491 A1 | * | 6/2006 | Yen et al. | 375/345 |

FOREIGN PATENT DOCUMENTS

| | | | |
|---|---|---|---|
| JP | 53-048452 A | 5/1978 |
| JP | 55-115724 A | 9/1980 |
| JP | 1-137832 A | 5/1989 |
| JP | 7-226683 A | 8/1995 |
| JP | 8-274688 A | 10/1996 |
| JP | 8-321143 A | 12/1996 |
| JP | 2000-224080 A | 8/2000 |

OTHER PUBLICATIONS

Syed Masood Ali, Rabin Raut, Mohamad Sawan "Digital Encoders for High Speed Flash-ADCs:Modeling and Comparison" 1-44244-0417-7/06.

* cited by examiner

*Primary Examiner* — Leon-Viet Nguyen
*Assistant Examiner* — Sarah Hassan
(74) *Attorney, Agent, or Firm* — Arent Fox LLP

(57) ABSTRACT

A reception circuit includes: an AD converter; an equalization circuit that equalizes an output of the AD converter; a determination circuit to which error information is input from the equalization circuit; and a controller that adjusts at least one of resolution and voltage range of the AD converter, in the circuit the determination circuit outputs a control signal to adjust at least one of resolution and voltage range to the controller based on the error information.

20 Claims, 39 Drawing Sheets

FIG.12

|  | 4 BITS | 3 BITS | 2 BITS | 1 BIT |
|---|---|---|---|---|
| C15 | ——— | × | × | × |
| C14 | ——— | ○ | × | × |
| C13 | ——— | × | × | × |
| C12 | ——— | ○ | ○ | × |
| C11 | ——— | × | × | × |
| C10 | ——— | ○ | × | × |
| C9 | ——— | × | × | × |
| C8 | ——— | ○ | ○ | ○ |
| C7 | ——— | × | × | × |
| C6 | ——— | ○ | × | × |
| C5 | ——— | × | × | × |
| C4 | ——— | ○ | ○ | × |
| C3 | ——— | × | × | × |
| C2 | ——— | ○ | × | × |
| C1 | ——— | × | × | × |

FIG.16

|  | 4 BITS | 3 BITS | 2 BITS | 1 BIT |
|---|---|---|---|---|
| C15 | —— | × | × | × |
| C14 | —— | × | × | × |
| C13 | —— | × | × | × |
| C12 | —— | × | × | × |
| C11 | —— | ○ | × | × |
| C10 | —— | ○ | × | × |
| C9 | —— | ○ | ○ | × |
| C8 | —— | ○ | ○ | ○ |
| C7 | —— | ○ | ○ | × |
| C6 | —— | ○ | × | × |
| C5 | —— | ○ | × | × |
| C4 | —— | × | × | × |
| C3 | —— | × | × | × |
| C2 | —— | × | × | × |
| C1 | —— | × | × | × |

FIG.30

| QUANTIZATION RANGE | PRECISION | | | | | |
|---|---|---|---|---|---|---|
| | 1 | 2 | 3 | 4 | 5 | 6 |
| 1 | 1.6E-02 | 3.1E-02 | 6.3E-02 | 1.3E-01 | 2.5E-01 | 5.0E-01 |
| 2 | 3.1E-02 | 6.3E-02 | 1.3E-01 | 2.5E-01 | 5.0E-01 | 1.0E+00 |
| 3 | 4.7E-02 | 9.4E-02 | 1.9E-01 | 3.8E-01 | 7.5E-01 | 1.5E+00 |
| 4 | 6.3E-02 | 1.3E-01 | 2.5E-01 | 5.0E-01 | 1.0E+00 | 2.0E+00 |
| 5 | 7.8E-02 | 1.6E-01 | 3.1E-01 | 6.3E-01 | 1.3E+00 | 2.5E+00 |

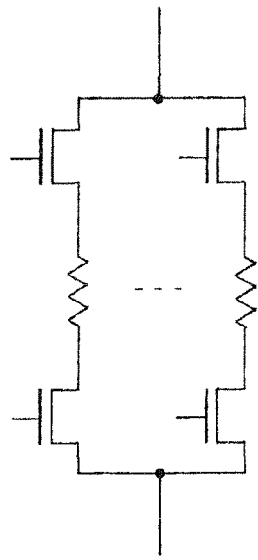
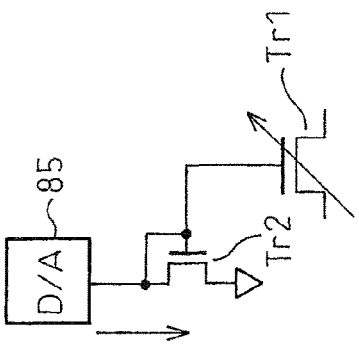
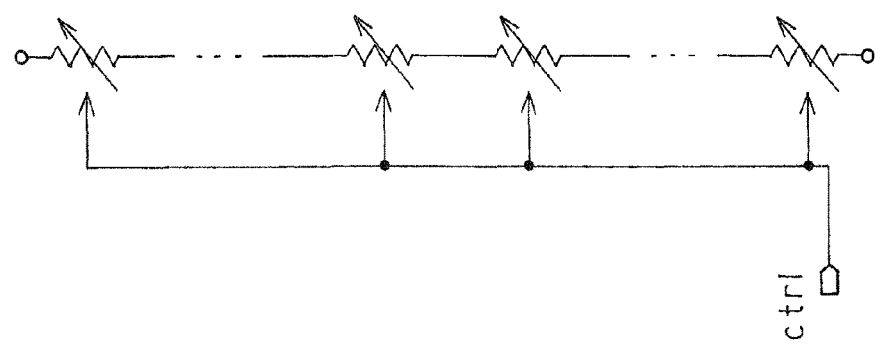

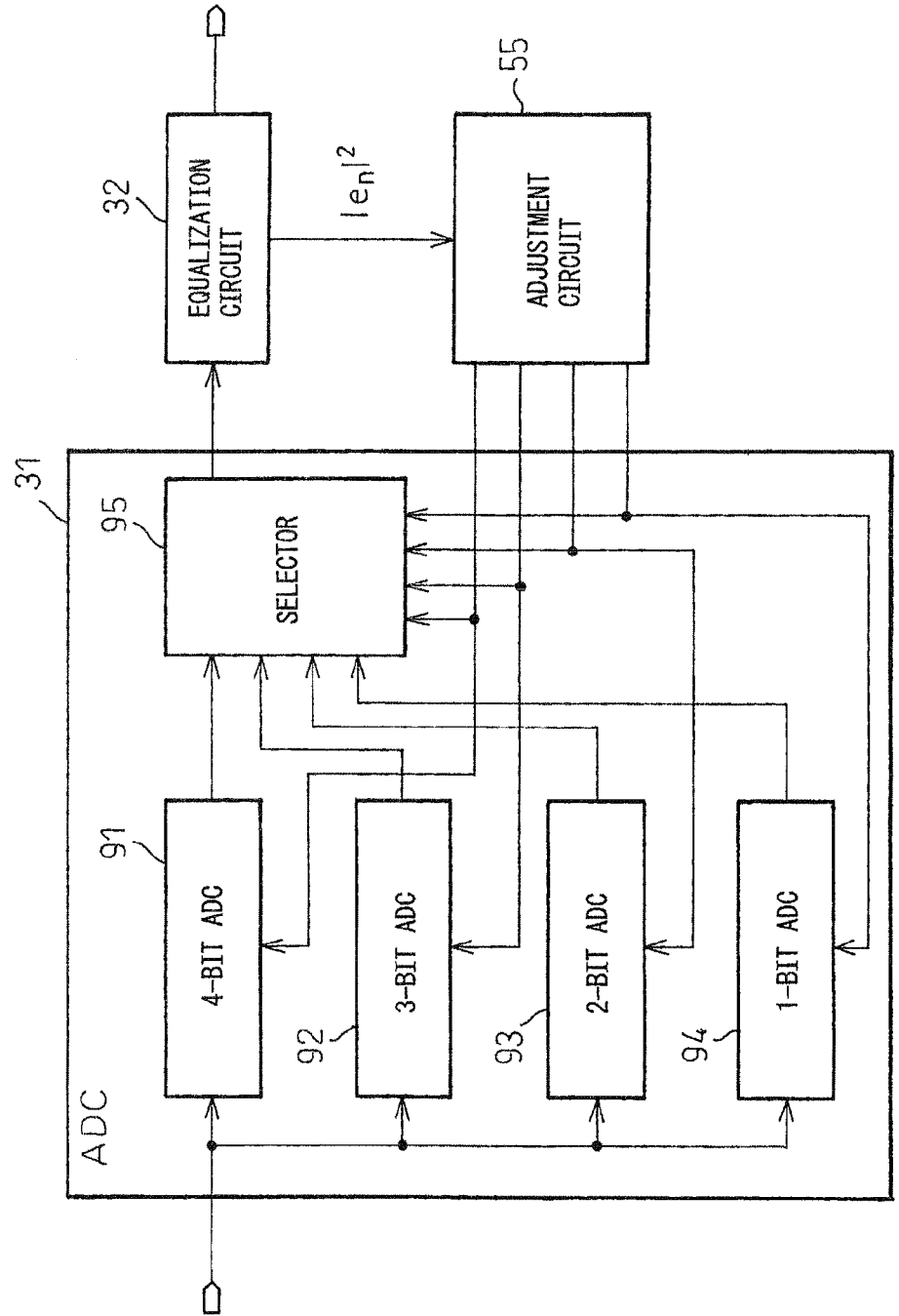

RECEPTION CIRCUIT, RECEPTION METHOD, AND SIGNAL TRANSFER SYSTEM

CROSS-REFERENCE TO RELATED APPLICATIONS

This application is a continuation application and is based upon PCT/JP2007/069849, filed on Oct. 11, 2007, the entire contents of which are incorporated herein by reference.

FIELD

The embodiments discussed herein are related to a transmission/reception system that performs signal transfer between a plurality of circuit blocks within a chip, signal transfer between LSI chips, and signal transfer between boards and between cases, etc., a transmission/reception method, a reception circuit constituting the system, and a reception method.

BACKGROUND

FIG. 1 is a diagram illustrating a schematic configuration of a high-speed signal transfer system. As illustrated in FIG. 1, the signal transfer system has a transmission circuit 1, a transfer line 2, and a reception circuit 3. In the transmission circuit 1, low-speed parallel data is converted into serial data in a multiplexer (MUX) 11 and the serial data is output to the transfer line 2 by a driver 12 having an output impedance the same as the characteristic impedance of the transfer line 2. The serial data is input to the reception circuit 3 via the transfer line 2. An input reception waveform received by the reception circuit 3 is deteriorated by the characteristics of the transfer line 2. Specifically, the high-frequency component is lost and the waveform is dulled.

Data to be transmitted is two-value data of "0" and "1" and when the degree of deterioration through the transfer line 2 is low, the input reception waveform for the serial data indicated by a string of "0's" and "1's" on the lower side is such that as illustrated in FIG. 2A. With this received signal waveform, it is possible to correctly reproduce the received data by setting a threshold level to a level indicated by the broken line and by determining the waveform with a comparator.

However, when the transfer line 2 is long or the frequency of the transmission data is very high, the degree of deterioration through the transfer line 2 is high and the input reception waveform for the serial data indicated by a string of "0" and "1" on the lower side is such that illustrated in FIG. 2B. With such a received signal waveform, it may not be possible to correctly reproduce received data by determining the waveform using only one comparator. In order to deal with this, the signal level is detected in accordance with a clock of the received data as illustrated in FIG. 2B and then the received data is reproduced correctly.

Because of this, as illustrated in FIG. 1, the reception circuit 3 samples the received signal (analog waveform) and digitizes the signal using an analog/digital converter (ADC) 31 disposed at the input part. An equalization circuit (EQ) 32 shapes the waveform (equalization processing) so as to compensate for the deterioration of waveform through the transfer line. The received data that is shaped is determined to be a "0" or "1" and the determination result is converted from serial data into parallel data by a decision latch/demultiplexer (D/L DMUX) 33. A clock signal may be necessary for sampling in the ADC 31 and processing in the equalization circuit 32. A clock recovery unit (CRU) 34 reproduces a data clock from the received data output from the equalization circuit 32. In the circuits to be explained below, the CRU 34 is provided, however, an explanation is not given for the sake of simplification and it is not illustrated schematically.

FIGS. 3A and 3B are diagrams illustrating a configuration of an embodiment of the equalization circuit 32 called a decision feedback equalizer (DFE). FIG. 3A illustrates a conceptual diagram and FIG. 3B illustrates a specific circuit configuration. If a transfer function of the transfer line 2 is assumed to be H(z), adjustment is made so that the transfer function of a DFE 37 is 1-H(z). One sample received signal is H(z) and if the output 1-H(z) of the DEF 37 is added to the received signal H(z) by an adder 35, a signal without deterioration is output as a result and this is determined by a comparator 36. Due to this, transmission data $d_n$ may be received correctly. Specifically, in order to sequentially compensate for the influence of the previous sample data, the sample data ahead by one sample is delayed by one sampling period and the sample data ahead by two samples is delayed by two sampling periods, and in this manner, the sample data is delayed sequentially up to that ahead by a certain number of samples and the delayed data is multiplied by a coefficient in accordance with the degree of influence and added to input data.

As illustrated in FIG. 3B, the equalization circuit 32 has the DFE 37 having a plurality of multipliers $c_n0$ to $c_nm$, a plurality of the adders 35, the comparator 36, a switch 38 that switches between feedback of data having been subjected to equalization processing and feedback of training data, a comparator 39 that binarizes data to be fed back, a plurality of delay units 40 that generate data to be applied to $c_n1$ to $c_nm$ after delaying the binarized feedback data, a subtracter 41 that calculates a difference between the data having been subjected to equalization processing and the binarized feedback data and generates an amount of error $e_n$, and a coefficient update part (e.c. LMS (Least-mean-square)) 42 that updates the coefficients of the multipliers $c_n0$ to $c_nm$ so that the amount of error is small based on the amount of error $e_n$. The multiplier $c_n0$ multiplies the data output from the ADC 31 by a certain coefficient and outputs the data and the multipliers $c_n1$ to $c_nm$ multiply the previous sample data that is delayed by a certain coefficient and output the data, and the data is added by the adder 35.

H(z) is a z function and because of the limitations of hardware, normally, the terms beyond a certain finite term are truncated. To the coefficients of the multipliers $c_n0$ to $c_nm$, the values acquired by applying the LMS algorithm are set here, however, there may be a case where fixed values are set in advance. The coefficients of the multiplier represent the frequency characteristic of the transfer line. The amount of error, which is an input to the coefficient update part 42, is an error from an ideal waveform that remains even after the waveform shaping using the coefficients. The magnitude of the error represents the quality of the shaped waveform.

The equalization circuit is described in, for example, patent document 1, and therefore, no further explanation is provided.

Returning to FIG. 1, in order that equalization processing is performed correctly in the equalization circuit 32, it may be necessary for the ADC 31 to have an appropriate range of input signal (input quantization range) and precision (resolution).

FIG. 4 illustrates a configuration of a conventional example for appropriately controlling the input quantization range of the ADC in a high-speed signal transfer system. This configuration is described in, for example, patent document 2. In the configuration in FIG. 4, a peak/bottom detection circuit 45 is provided, which detects the maximum value (peak value) and the minimum value (bottom value) of the voltage of the signal waveform (analog signal) received by the reception circuit 3, and the reference voltage of the ADC 31 is adjusted, and thereby, it is possible to quantize the entire range of input signal.

FIG. 5 is a diagram illustrating a configuration of the ADC 31 used in the configuration in FIG. 4. There are various types for the ADC; however, an ADC that may be used generally in high-speed signal transfer as high as Giga bits/sec is almost limited to a flash type at present. As illustrated in FIG. 5, in a flash type ADC, between a high-side reference potential VrefH generated by a VrefH generation circuit 46 and a low-side reference potential VrefL generated by a VrefL generation circuit 47, a resistor string (ladder resistor) 48 is provided and a divided potential, which is the reference potential divided, is generated at the connection node of the resistors. Each of a plurality of comparators 49 compares a voltage V1 of an input signal (input voltage) with a divided potential. When Vi is smaller than a certain divided potential, the output of the comparators located on the upper side of the comparator 49 that made comparison with the divided potential is "0" and the comparators located on the lower side of the comparator, including the comparator 49 that made comparison, is "1", which is a so-called thermometer style, and when the outputs of the plurality of comparators 49 are encoded by an encoder 50, a digital output in the binary form in accordance with the level of Vi is obtained. For an N-bit ADC without an interpolation method, $(2^N-1)$ comparators are desired. Although not illustrated schematically, the comparator includes an amplifier. The part including the VrefH generation circuit 46, the VrefL generation circuit 47 and the ladder resistor 48 is referred to as a reference generation circuit and the part including the amplifier and the comparators is referred to as an ADC core.

The ADC in FIG. 5 has the VrefH generation circuit 46 that generates the high-side reference potential VrefH and the VrefL generation circuit 47 that generates the low-side reference potential VrefL because of the use in the configuration in FIG. 4, and is configured so that VrefH and VrefL are adjusted by the peak/bottom detection circuit 45. In the configuration in FIG. 5, it is possible to adjust both VrefH and VrefL; however, there may be a case where VrefL is a fixed potential (for example, ground) and only VrefH may be adjusted. When the input quantization range is not adjusted, VrefH and VrefL are fixed.

By using such an ADC illustrated in FIG. 5, providing the peak/bottom detection circuit 45, and adjusting the reference voltage of ADC, it is possible to quantize the entire voltage range of input signal by the number of bits of ADC.

FIG. 6 illustrates a configuration of another conventional example for appropriately controlling the input quantization range of ADC in a high-speed signal transfer system. In the configuration illustrated in FIG. 6, an amplitude adjustment (AGC (Automatic gain control)) circuit 51 is provided at the input part of the reception circuit 3 and the input voltage range of the input signal to the ADC 31 is made substantially constant. In this configuration, it may not be necessary to adjust the input quantization range of the ADC 31 and an ADC in which VrefH and VrefL are fixed may be used without the need to provide the VrefH generation circuit 46 and the VrefL generation circuit 47 in the ADC in FIG. 5. Within the AGC circuit 51, it is normal to provide a peak/bottom detection circuit and perform feedback so that the signal amplitude after amplification is a certain value. The AGC circuit is a well-known circuit.

In general, the precision (resolution) of ADC, in other words, the number of bits of ADC is acquired in view of the signal waveform of the transmission circuit, the frequency characteristic (impulse response characteristic) of the transfer line, the sensitivity of ADC, the loss compensation performance (achieved SNR) of the equalization circuit, etc., and an ADC with an appropriate precision is selected based on the simulation result.

RELATED DOCUMENTS

Japanese Laid-open Patent Publication No. 2000-224080
Japanese Laid-open Patent Publication No. 7-226683
Japanese Laid-open Patent Publication No. 53-48452
Syed Masood Ali, Rabin Raut, Mohamad Sawan "Digital Encoders for High Speed Flash-ADCs: Modeling and Comparison" 1-4244-0417-7/06 IEEE

SUMMARY

According to a first aspect of the embodiment, a reception circuit includes: an AD converter; an equalization circuit that equalizes an output of the AD converter; a determination circuit to which error information is input from the equalization circuit; and a controller that adjusts at least one of resolution and voltage range of the AD converter, wherein the determination circuit outputs a control signal to adjust at least one of resolution and voltage range to the controller based on the error information.

The object and advantages of the embodiment will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 12 is a diagram illustrating a change in a valid comparator when the resolution (number of bits) is reduced in an AD converter (ADC) in the third embodiment.

FIG. 16 is a diagram illustrating another example of a change in the valid comparator when the resolution (number of bits) is reduced in an AD converter (ADC) in the third embodiment.

FIG. 30 is a diagram illustrating the content of a table of a reception circuit in a signal transfer system in the eighth embodiment.

FIGS. 38A to 38C are diagrams explaining a configuration in which the resistance value of each ladder resistive element of a ladder resistor is adjusted in a flash type ADC.

FIG. 39 is a diagram illustrating another configuration example of a reception circuit in a signal transfer system.

DESCRIPTION OF EMBODIMENTS

Figure 1:
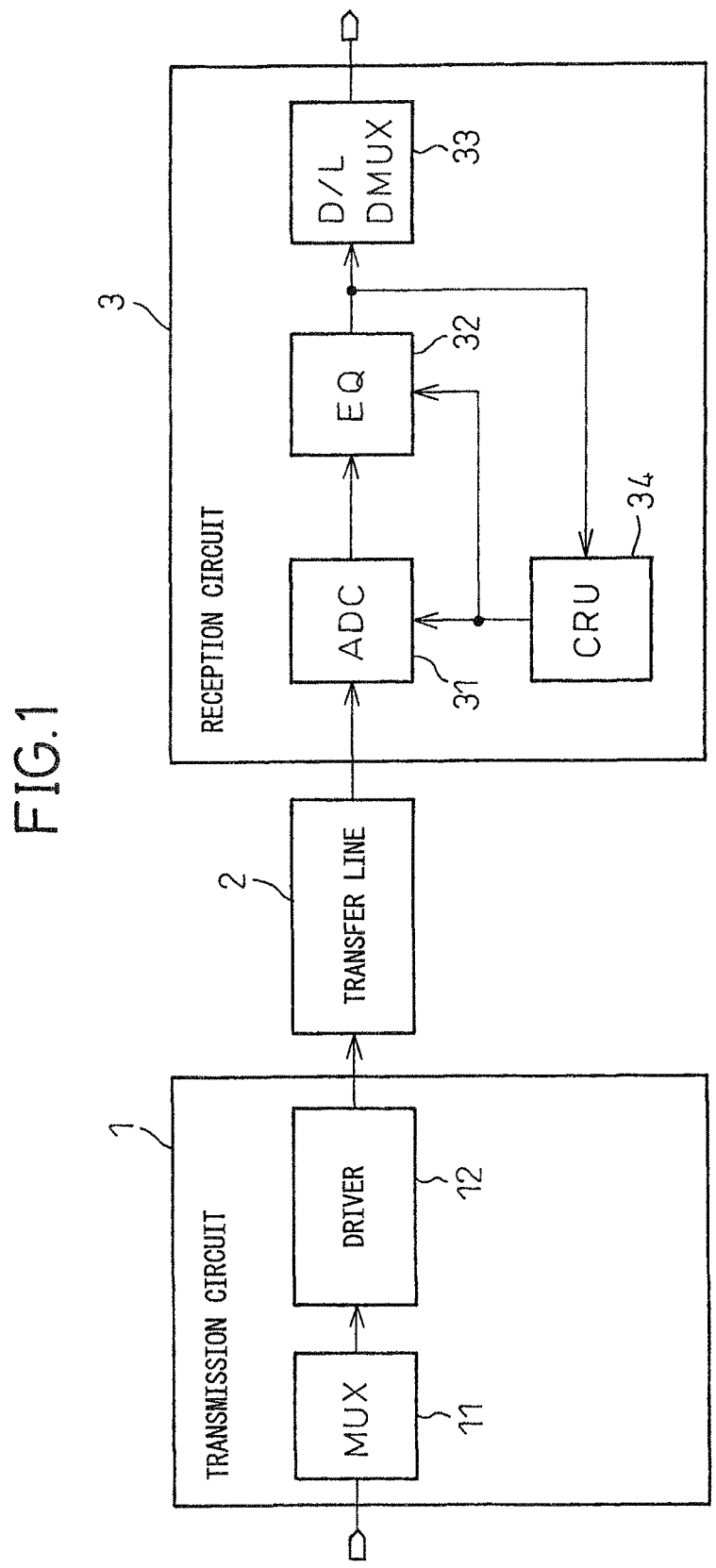
FIG. 1 a diagram illustrating a schematic configuration of a high-speed signal transfer system.
Figure 2A:
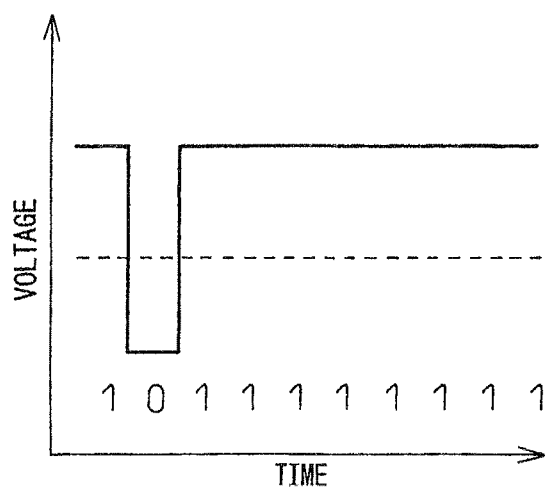
FIGS. 2A and 2B are diagrams explaining the deterioration of a received signal due to transfer and the necessity of an AD converter.
Figure 2B:
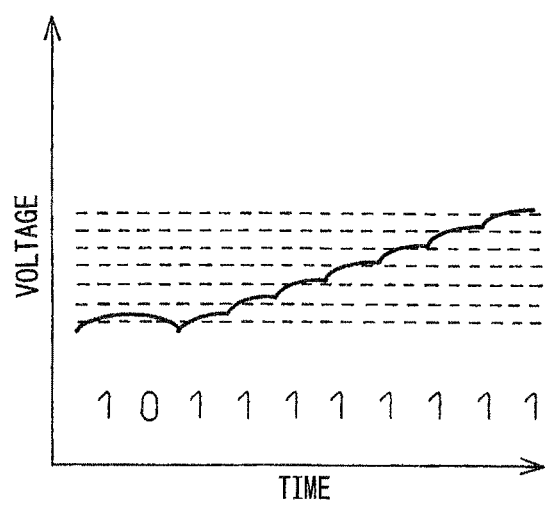

Before describing the embodiments, the problems of the above-mentioned conventional driving methods will be described.

As described above, in a high-speed signal transfer system, a flash type ADC is used. The number of amplifiers or comparators of a flash type ADC is larger compared to another type ADC with the same number of bits, and for n bits, the desired number of amplifiers and comparators is about $2^n-1$. Although it is possible to reduce the number by a certain amount by applying a data interpolation method or k-way time interleaving method, basically, a number of amplifiers and comparators may be necessary and the scale of the circuit is increased and the power consumption is also increased. Because of this, there is a problem that the power consumption of ADC accounts for most of the power consumption of the reception circuit, that is, about 60% to 80% of the power consumption of the reception circuit, and therefore, suppression of the power consumption of ADC is demanded.

If the number of bits is assumed to be n, the circuit scale of ADC is in proportion to $2^n$, and therefore, the power consumption increases rapidly as the number of bits increases. The number of bits of ADC represents the number of threshold values desired to correctly determine whether a received signal is 0 or 1 when the loss of the transfer line is small and large, respectively. When the loss of the transfer line is large, it may be necessary to increase the number of threshold values and when the loss of the transfer line is small, it is possible to correctly determine whether a received signal is 0 or 1 even if n=0, i.e., with a normal comparator.

As described above, the number of bits (resolution) of ADC is determined by taking into consideration various factors of a signal transfer system. However, when a design margin more than necessary for a change over time of the loss of a transfer line or for the case where the reception circuit is used commonly in different applications, and the loss is smaller than estimated at first, an ADC with precision more than necessary operates at all times, and therefore, electric power is consumed wastefully. This is because a circuit that may not be necessary to achieve desired precision, for example, part of the circuit of an amplifier, comparator, and encoder operates, and there is also a problem that noise is caused because of the operation of an unnecessary circuit and as a result of that, the system is affected adversely.

Although the number of bits (resolution) of ADC is determined by taking into consideration various factors of the signal transfer system, if different ADCs are manufactured in accordance with applications, a problem will arise that not only the cost is increased but also the read time is lengthened. Because of this, it may be conceived of that a general-purpose ADC with a certain number of bits is prepared and in an application for which an ADC with a smaller number of bits is sufficient, the general-purpose ADC is used to reduce the read time. Because the general-purpose ADC is mass-produced, and therefore, in most cases, the general-purpose ADC is less expensive even if the number of bits is large. However, when the general-purpose ADC is used, a problem will arise in that electric power is consumed wastefully when its resolution is not necessary.

According to embodiments, a reception circuit reduces wasteful power consumption by operating an ADC under optimum conditions in accordance with an actual signal transfer state in a reception circuit having an ADC and in a signal transfer system including such a reception circuit.

Figure 7:
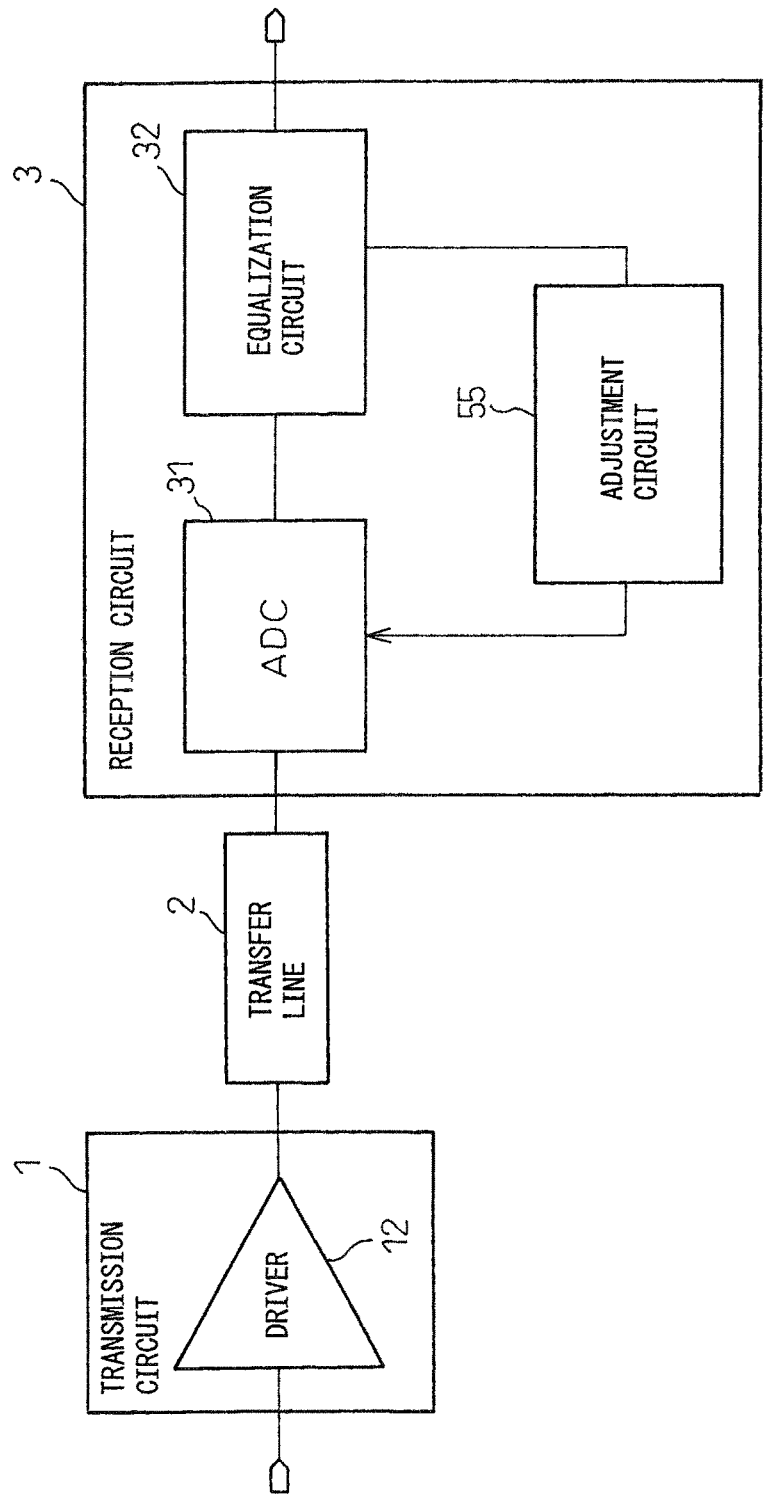
FIG. 7 is a diagram illustrating a basic configuration diagram of a signal transfer system of a first embodiment.

FIG. 7 is a diagram illustrating a basic configuration diagram of a signal transfer system of a first embodiment. As illustrated in FIG. 7, the signal transfer system of the first embodiment has the transmission circuit 1 having the driver 12, the transfer line 2 transferring a signal output from the driver 12, and the reception circuit 3 that receives a signal from the transfer line 2 and reproduces data. The reception circuit 3 includes, in addition to the ADC 31 and the equalization circuit 32, an adjustment circuit 55 that adjusts at least one of the input quantization range and precision (resolution) of the ADC 31 using computation result parameters output from the equalization circuit 32.

As described above, it is only desired for the ADC used in the signal transfer system in FIG. 7 to be capable of correctly determining 0/1 of a signal received by the equalization circuit 32. Because of this, in the first embodiment, at least one of the input quantization range and precision (resolution) of the ADC 31 is adjusted in accordance with the state of the received signal and the adjustment is made by making use of information generated in the equalization circuit 32. Due to this, it may not be necessary to separately provide a circuit to detect the state of a received signal, and therefore, adjustment may be made with a simple configuration. Then, by the adjustment, it is possible to reduce wasteful power consumption and noises caused by the wasteful power consumption.

According to the first embodiment, when the input quantization range is larger than necessary, it may be adjusted to an appropriate range and when the precision (resolution) is higher than necessary, it may be adjusted to an appropriate precision, and therefore, even if a general-purpose ADC with a sufficient input quantization range and number of bits is used, electric power is not consumed wastefully, and it is possible to appropriately use such a general-purpose ADC in accordance with the state of a received signal.

As described above, the amount of error in the equalization circuit is an error from the ideal waveform and indicates quality of a shaped waveform. In other words, if the amount of error is small, the shaped waveform may be reproduced in a shape close to the ideal waveform, and therefore, it may be thought that the waveform may be reproduced with sufficient quality even if the input quantization range and the number of bits of the ADC are reduced.

Further, the coefficient of the multiplier of the equalization circuit corresponds to the transfer characteristic of the transfer line. The transfer characteristic of the transfer line is estimated in advance by a simulation and a coefficient of the equalization circuit in accordance with the characteristic is stored in advance. When an actual coefficient of the equalization circuit when processing to optimize the equalization circuit in accordance with an input signal is performed is different from the stored coefficient, this may be thought because the actual transfer characteristic of the transfer line is different from the estimated transfer characteristic or because of the error of the ADC. Because of this, when the actual coefficient is better than the stored coefficient, for example, the coefficients other than $c_n 0$ are small, it may be thought that the actual transfer characteristic is better than the estimated transfer characteristic, and therefore, it may thought that the waveform may be reproduced with sufficient quality even if the input quantization range and the number of bits of the ADC are reduced.

As described above, by making use of the parameters of the equalization circuit, such as the amount of error and the coefficients, it is possible to obtain information desired to change the input quantization range and the number of bits of the ADC. Hitherto, it has not been performed to change the input quantization range and the number of bits of the ADC by making use of the information. By making use of the information, it may not be necessary to separately provide a circuit to detect the state of a received signal.

The adjustment of the ADC is determined by controlling feedback so that a certain reproduction level may be obtained by changing at least one of the input quantization range and the number of bits while monitoring the parameters of the equalization circuit, or is set by referring to the table of the input quantization range and the number of bits determined in advance in accordance with the parameters of the equalization circuit. It is also possible to perform both the feedback control and the reference to the table at the same time.

When the feedback control is performed, the amount of error of the equalization circuit is used. When the amount of error is large, the input quantization range and the number of bits of ADC are increased and the amount of error is controlled so as to become smaller than a threshold value calculated from the error rate of the signal transfer system, and when the amount of error is sufficiently small, it is judged that the input quantization range and the number of bits are more than necessary and the amount of error is controlled so as to become an appropriate one.

The reference to the table of the input quantization range and the number of bits of the ADC may be done both by the amount of error and by the coefficient of the equalization circuit.

As described above, a flash type ADC has a reference generation circuit, an ADC core including an amplifier and a comparator, and an encoder. The adjustment of the input quantization range of a flash type ADC is made by changing the reference potential generated by the reference circuit or by bringing part of the ADC core into a non-operating state. When the potential difference between the high-side reference potential VrefH and the low-side reference potential VrefL becomes small, the amount of electric current that flows through the ladder resistor becomes smaller and the power consumption is reduced. In order to suppress the influence of noises, it may be necessary to increase the current that flows through the ladder resistor to a certain magnitude, and the power consumption resulting from the current that flows through the ladder resistor occupies a large part of the power consumption of the ADC. Because of this, the reduction in the potential difference between VrefH and VrefL due to the reduction in the input quantization range reduces the power consumption of the ADC.

The change of the precision (resolution) of the ADC is realized by bringing the gate of part of the ADC core and encoder into the non-operating state, specifically, by clipping the output of the gate of part of the ADC core to a fixed value so that the gates in the subsequent stages do not perform the switching operation. The electric power consumed in the switch operation also occupies a large part of the power consumption of ADC, and therefore, it is possible to reduce the power consumption of ADC by clipping the output of the gate to a fixed value. This also applies to the case where the adjustment of the input quantization range is made by bringing part of the ADC core into the non-operating state.

When an output bit selector is provided at the output part of ADC and the number of bits to be output from the ADC is limited, the power consumption of the ADC itself may not be reduced; however, the power consumption of the equalization circuit, etc., may be reduced. This also applies when an input bit selector is provided at the input part of the equalization circuit.

Figure 8:
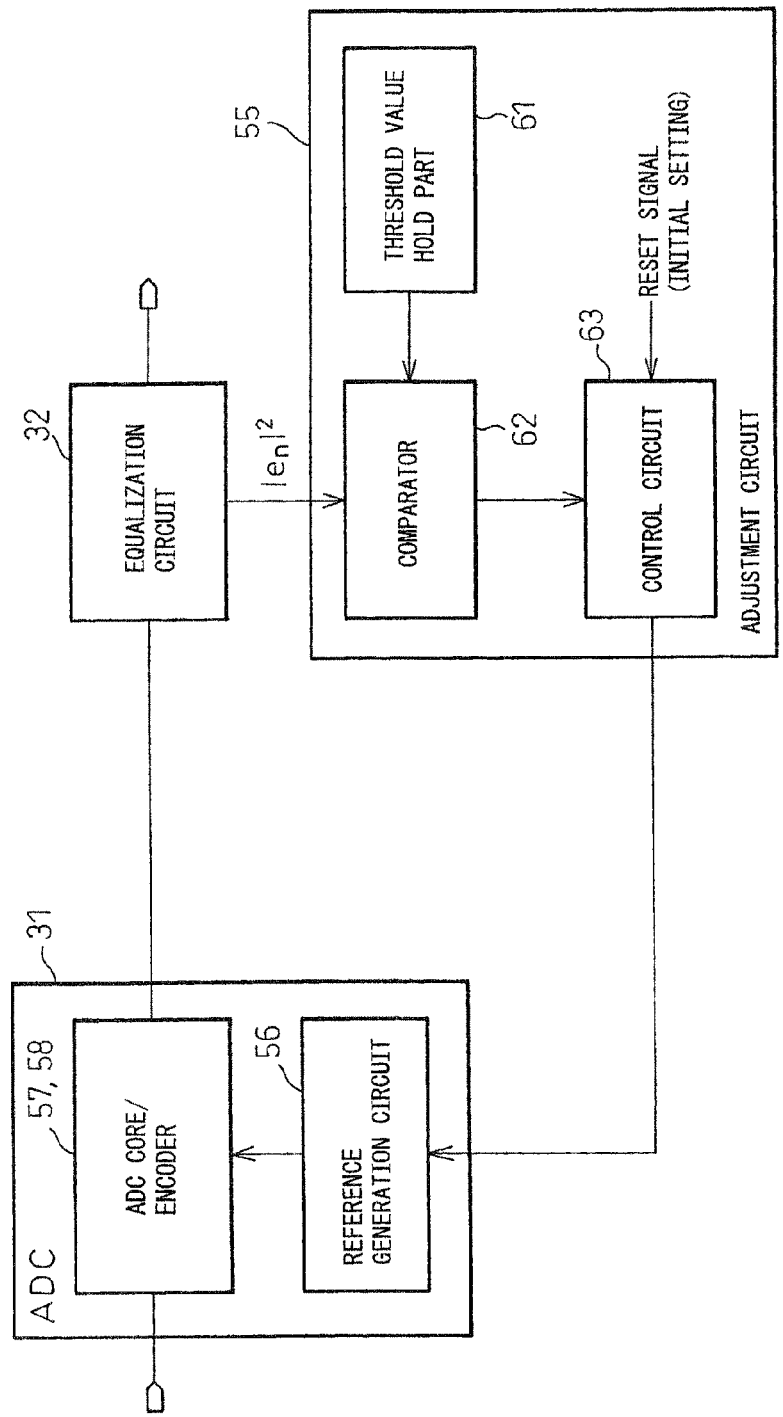
FIG. 8 is a diagram illustrating a configuration of a reception circuit in a signal transfer system in a second embodiment.

A signal transfer system in a second embodiment has a basic configuration as illustrated in FIG. 7. FIG. 8 is a block diagram illustrating a configuration of a reception circuit 3 in the second embodiment. As illustrated in FIG. 8, an ADC 31 has a reference generation circuit 56, an ADC core 57, and an encoder 58. The ADC core 57 and the encoder 58 are illustrated together as one block. From an equalization circuit 32, the square value of an error is output as error information. An adjustment circuit 55 has a threshold value hold part 61 that holds a threshold value, a comparator 62 that compares error information from the equalization circuit 32 with a threshold value, and a control circuit 63 that controls the reference circuit based on the comparison result. When a reset signal that specifies an initial setting is input, the control circuit 63 sets the quantization range (voltage range) of the ADC 31 somewhat higher and then starts the adjustment operation of the quantization range of the ADC 31. After the adjustment is completed, the adjusted state may be maintained or adjustment may be made at any time.

Figure 3A:
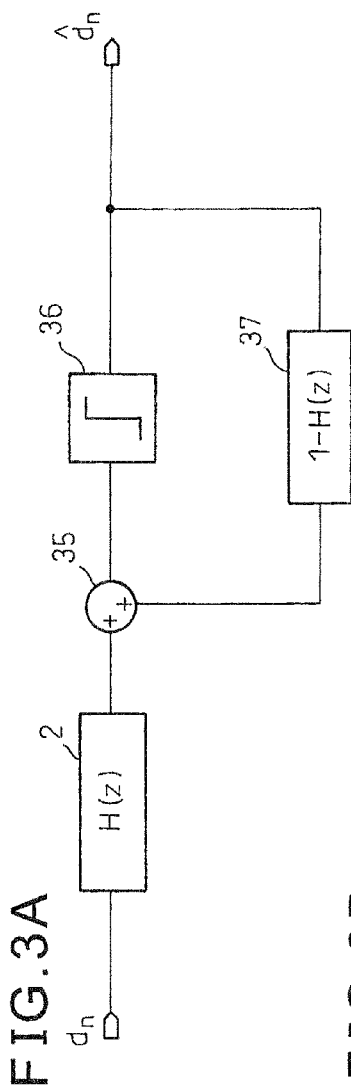
FIGS. 3A and 3B are diagrams illustrating a schematic configuration of an equalization circuit of DFE (Decision Feedback Equalizer) type in a conventional example and a detailed configuration thereof.
Figure 3B:
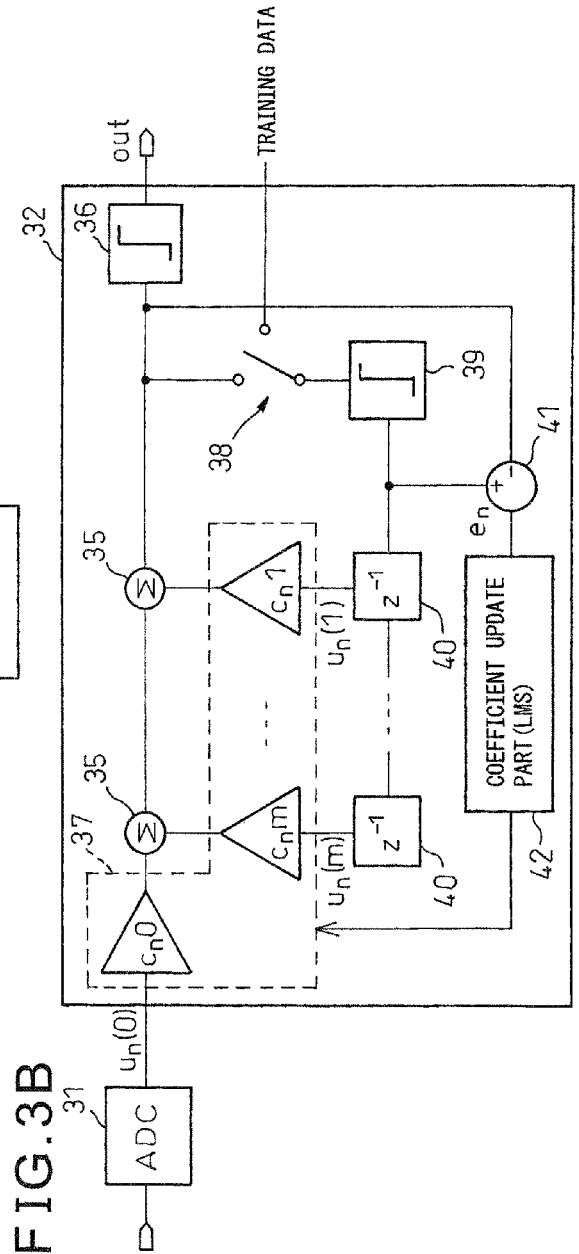
Figure 4:
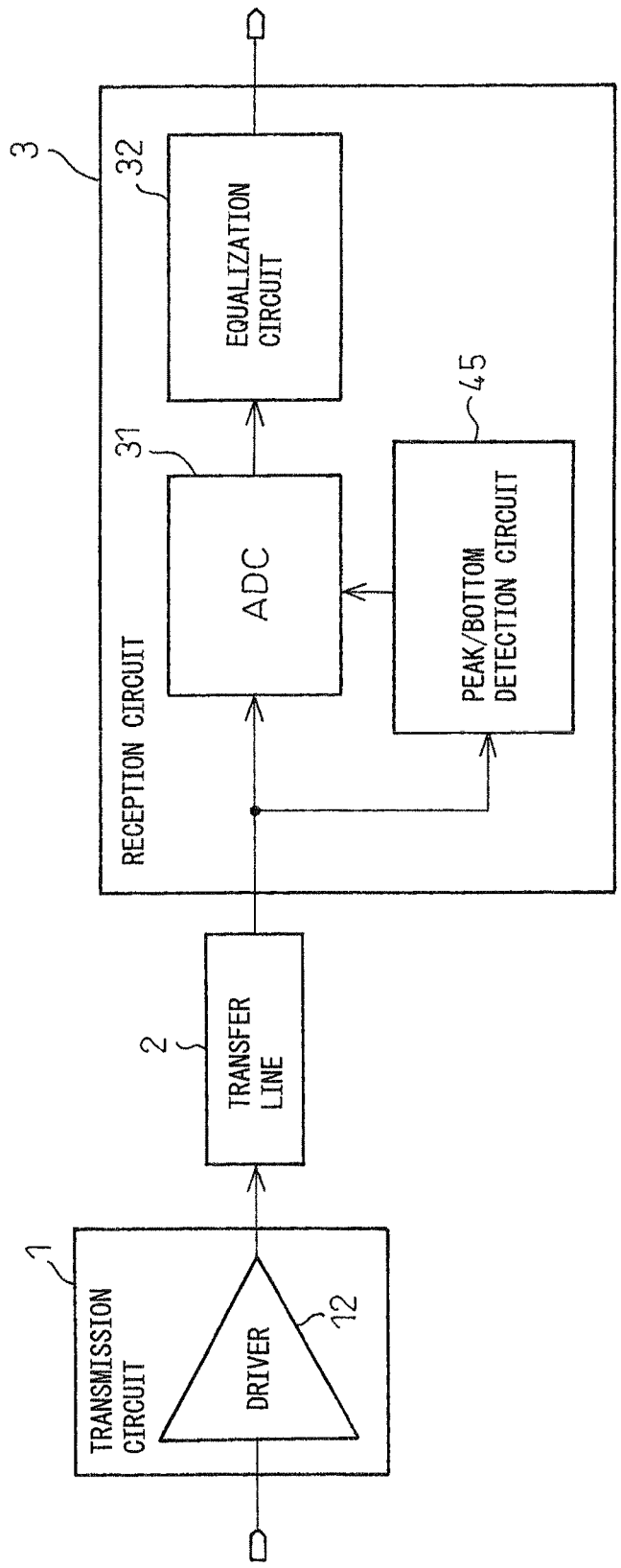
FIG. 4 is a diagram illustrating a configuration of a signal transfer system in a conventional example, which adjusts an input quantization range of an ADC.
Figure 9:
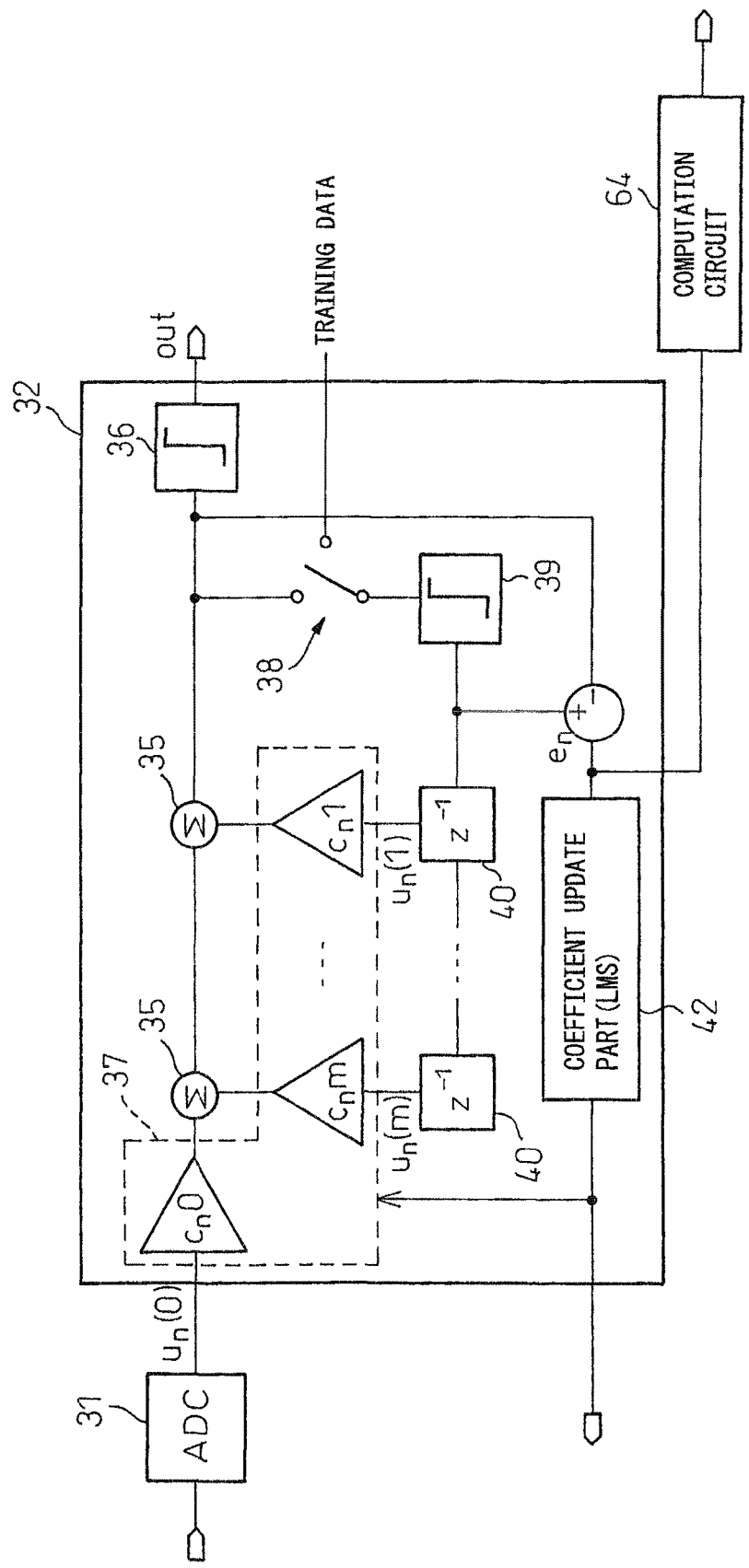
FIG. 9 is a diagram illustrating a configuration of an equalization circuit in the second embodiment.

FIG. 9 is a diagram illustrating a configuration of the equalization circuit 32 in the second embodiment. The equalization circuit 32 has a configuration similar to that in FIG. 3(B), however, differs in that a computation circuit 64 that calculates the square of an amount of error $e_n$ (error value) is provided. The result of calculation of the computation circuit 64 is sent to the comparator 62 of the adjustment circuit. The amount of error $e_n$ may also be detected from the normal transmission data. Consequently, it is possible for the adjustment circuit 55 to make adjustment at all times by receiving the error value.

Figure 5:
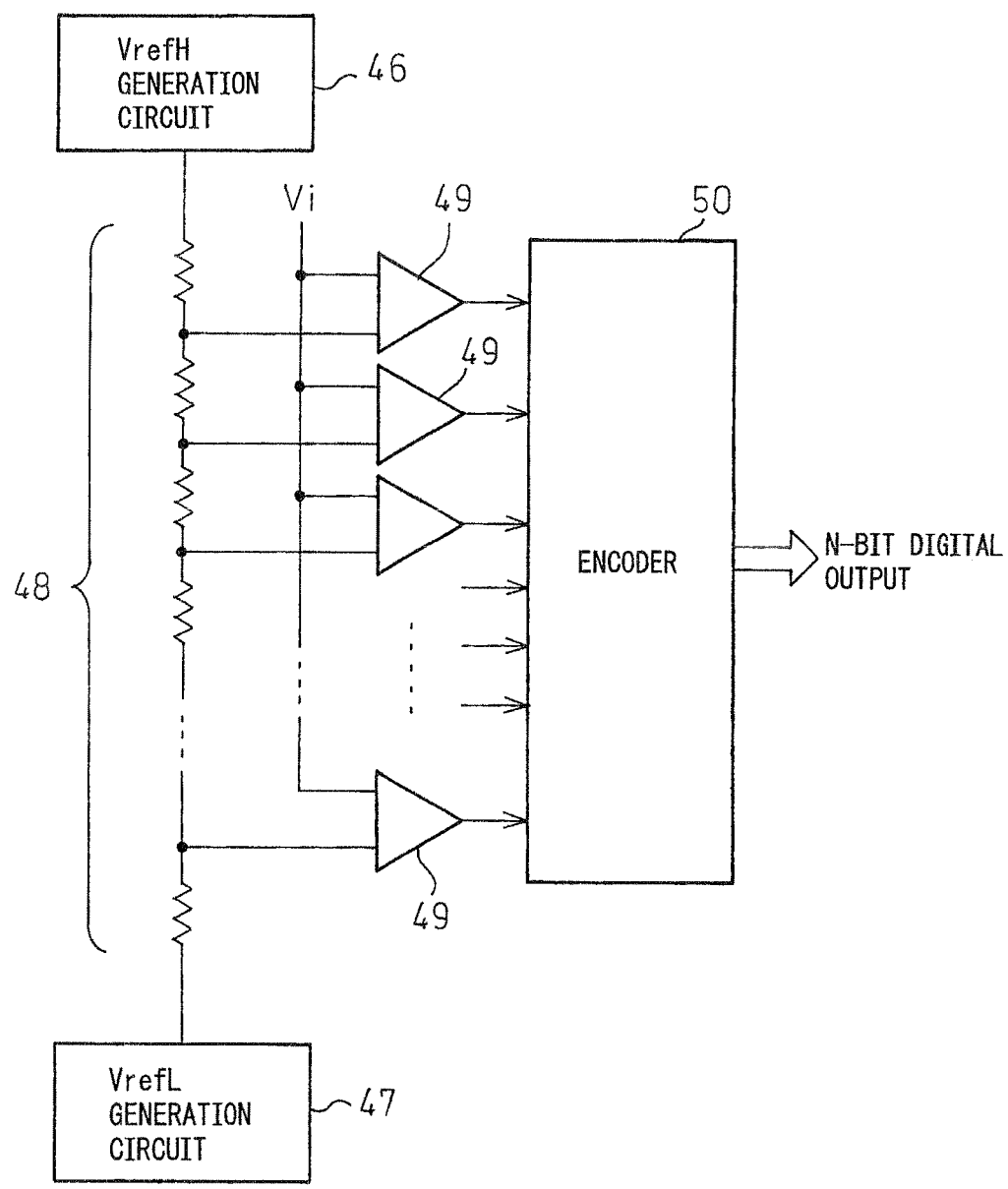
FIG. 5 is a diagram illustrating a configuration of an ADC used in the system in FIG. 4.
Figure 6:
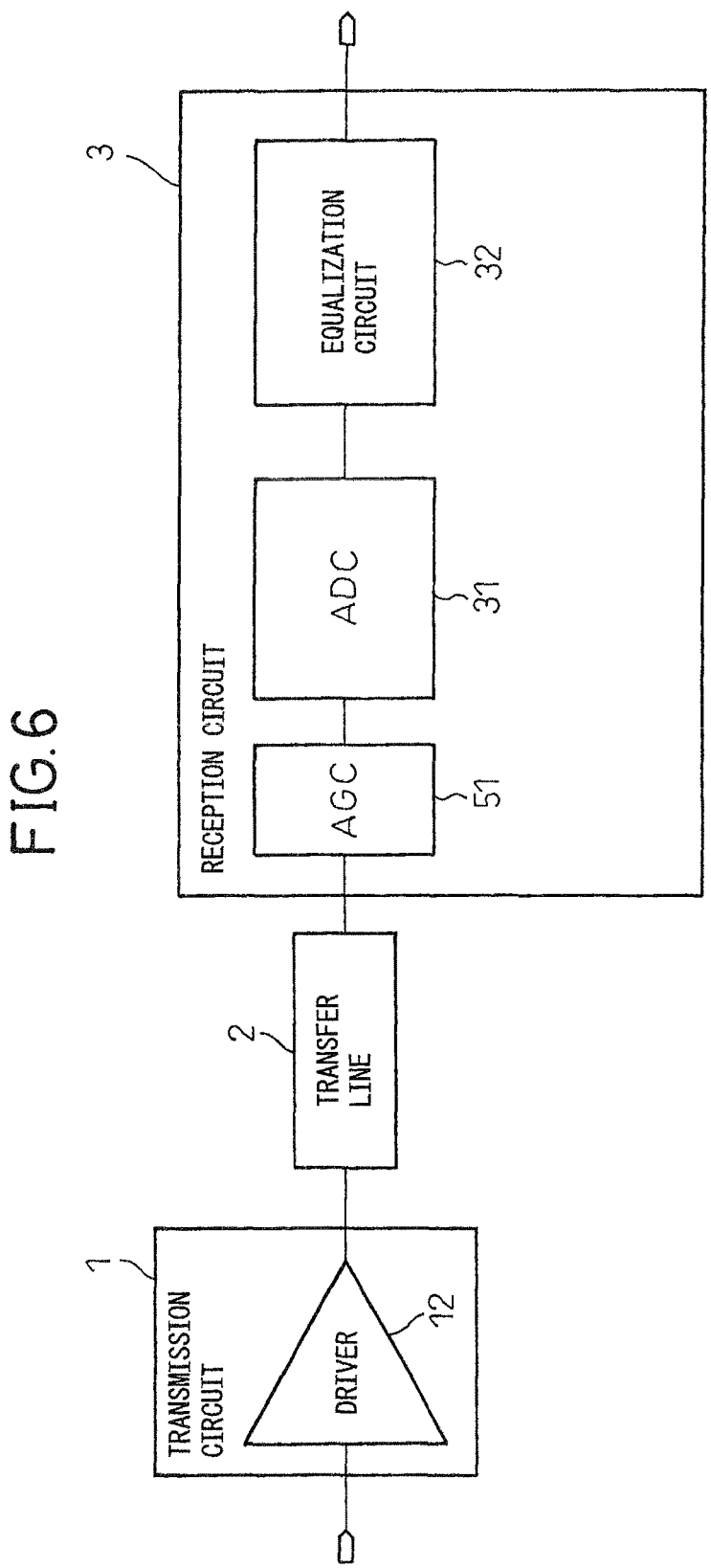
FIG. 6 is a diagram illustrating a configuration of a signal transfer system in a conventional example, which adjusts the amplitude of a signal to be input to an ADC.

The ADC 31 in the second embodiment has the same configuration as that in FIG. 5. The reference generation circuit 56 has a VrefH generation circuit 46, a VrefL generation circuit 47, and a ladder resistor 48, and a high-side reference potential VrefH and a low-side reference potential VrefL may be adjusted. In other words, the input quantization range of the ADC 31 may be adjusted. This configuration resembles the configuration described in patent document 2. There may also be a modified example, in which only the VrefH generation circuit 46 is provided and the VrefL generation circuit 47 may be not provided. The VrefH generation circuit 46 and the VrefL generation circuit 47 may be any circuit as long as it may generate a certain voltage and it is known that they may be realized by utilizing, for example, a DA converter.

The comparator 62 compares the error value from the equalization circuit 32 with a certain threshold value held in the threshold value hold part 61 and outputs the comparison result to the control circuit 63. When the error value is smaller than the threshold value, the control circuit 63 determines that no problem will be brought about even if the amount of error increases and controls the reference circuit 56 so as to reduce the difference between VrefH and VrefL, and when the error value is larger than the threshold value, the control circuit 63 controls the reference circuit 56 so as to increase the difference between VrefH and VrefL. This processing is repeated and the feedback control is performed so that the potential difference between VrefH and VrefL is as small as possible in the range in which the error value is equal to or less than a threshold value. When the potential difference between VrefH and VrefL becomes small, the amount of current that flows through the ladder resistor is reduced and the power consumption is also reduced.

Figure 10:
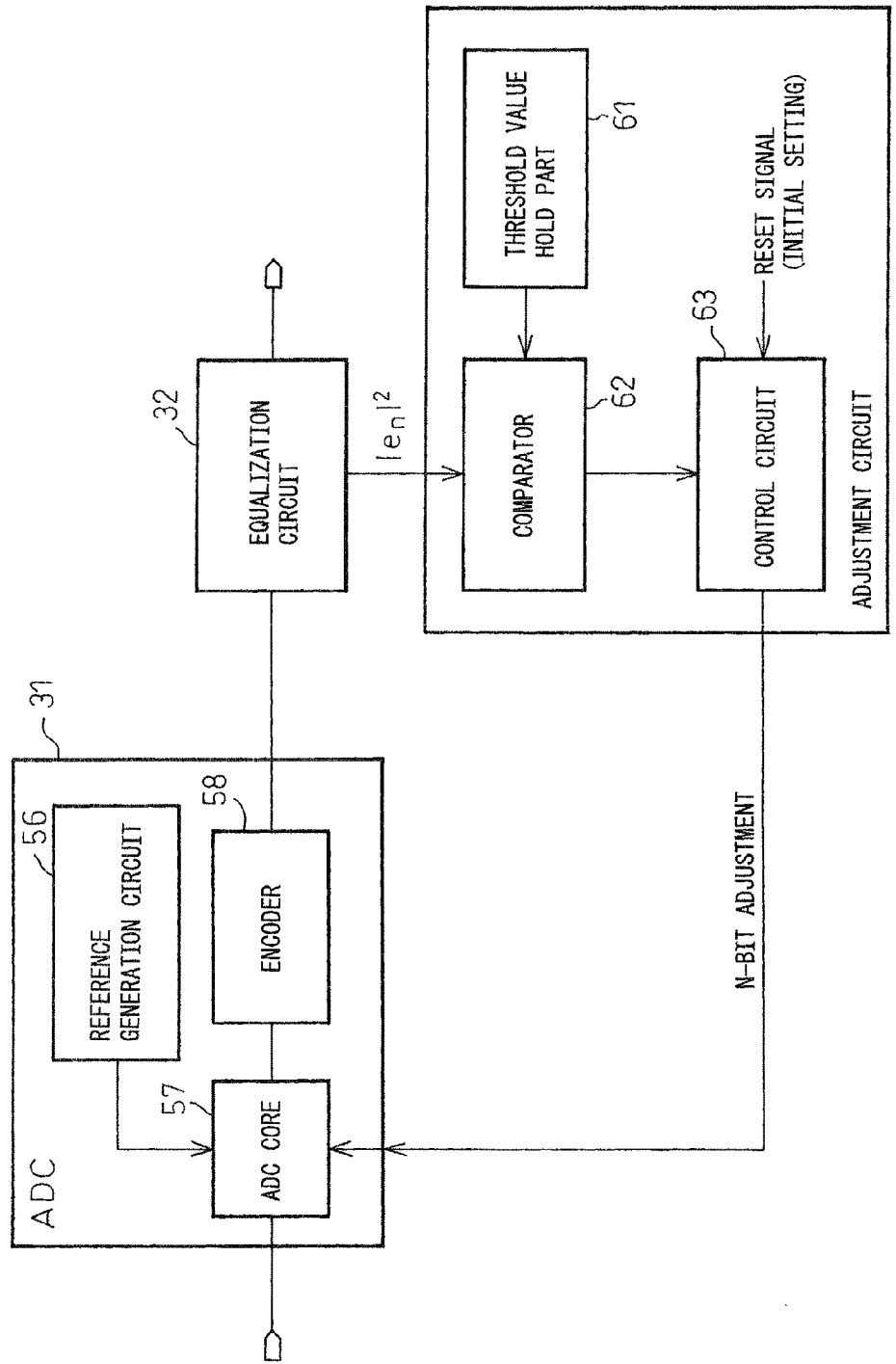
FIG. 10 is a diagram illustrating a configuration of a reception circuit in a signal transfer system in a third embodiment.

A signal transfer system in a third embodiment has the basic configuration as illustrated in FIG. 7. FIG. 10 is a block diagram illustrating the configuration of the reception circuit 3 in the third embodiment. As illustrated in FIG. 10, in the second embodiment, the control circuit 63 controls the reference generation circuit 56 to change the input quantization range of the ADC 31; however, the third embodiment differs from the second embodiment in that the number of operation bits of the ADC core 57 is adjusted and the other parts are the same as those in the second embodiment.

Figure 11:
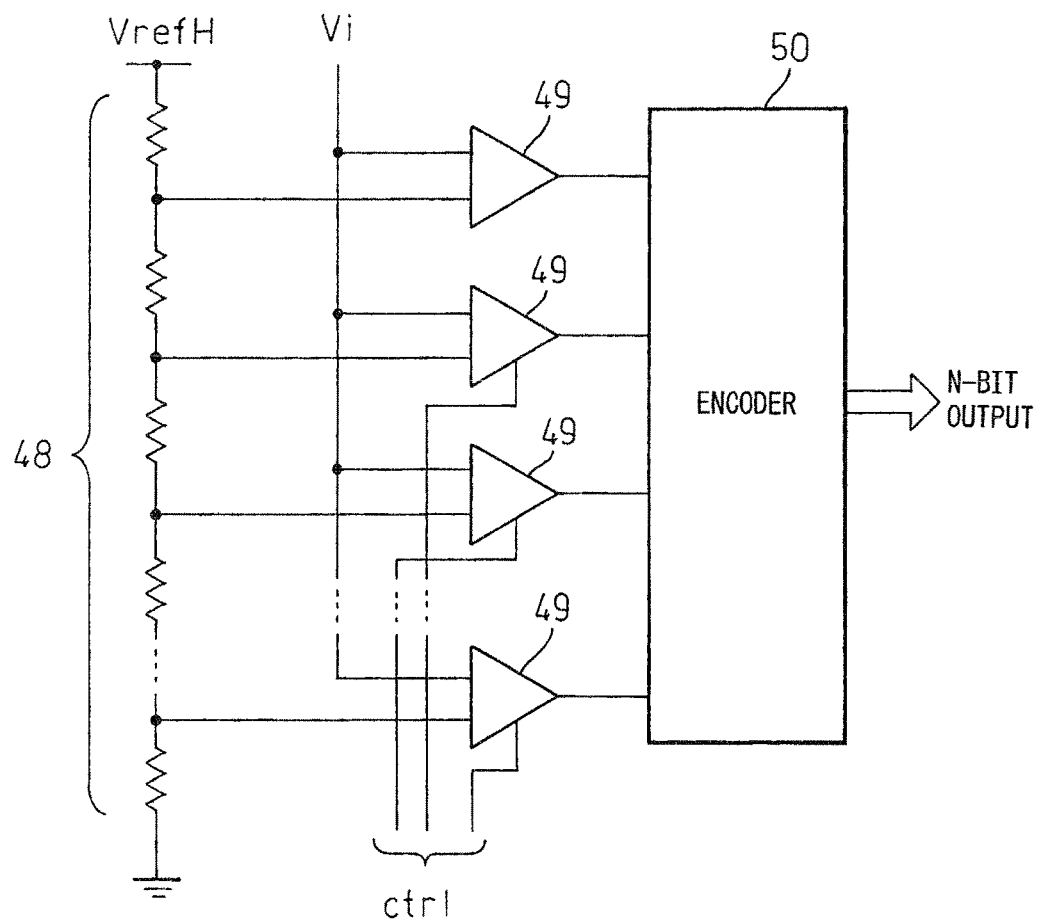
FIG. 11 is a diagram illustrating a configuration of an AD converter (ADC) in the third embodiment.

FIG. 11 is a diagram illustrating a circuit configuration of the ADC 31 in the third embodiment. The ADC has a configuration similar to that of the ADC in FIG. 5; however, differs from the ADC in FIG. 5 in that Vrefh is a fixed voltage and VrefL is the ground level because Vrefh and VrefL are not adjusted in the third embodiment and in that the configuration is such that a comparator 49 in relation to an unnecessary bit is brought into the non-operating state by an N-bit adjustment signal ctrl from the control circuit 63.

FIG. 12 is a diagram explaining the operating state of the comparator 49 when the valid bits are changed in the 4-bit ADC 31. Normally, the 4-bit ADC has 15 comparators C1 to C15. When four bits are valid, all of the 15 comparators C1 to C15 are in the operating state. In contrast to this, when control is made so that three bits are valid, the seven comparators C2, C4, C6, C8, C10, C12 and 014 are in the operating state and the other eight comparators C1, C3, . . . , C15 are brought into the non-operating state. When control is made so that two bits are valid, the three comparators C4, C8 and C12 are in the operating state and the other 12 comparators may brought into the non-operating state. When control is made so that one bit is valid, only the comparator C8 is in the operating state and the other 14 comparators may be brought into the non-operating state.

Figure 13:
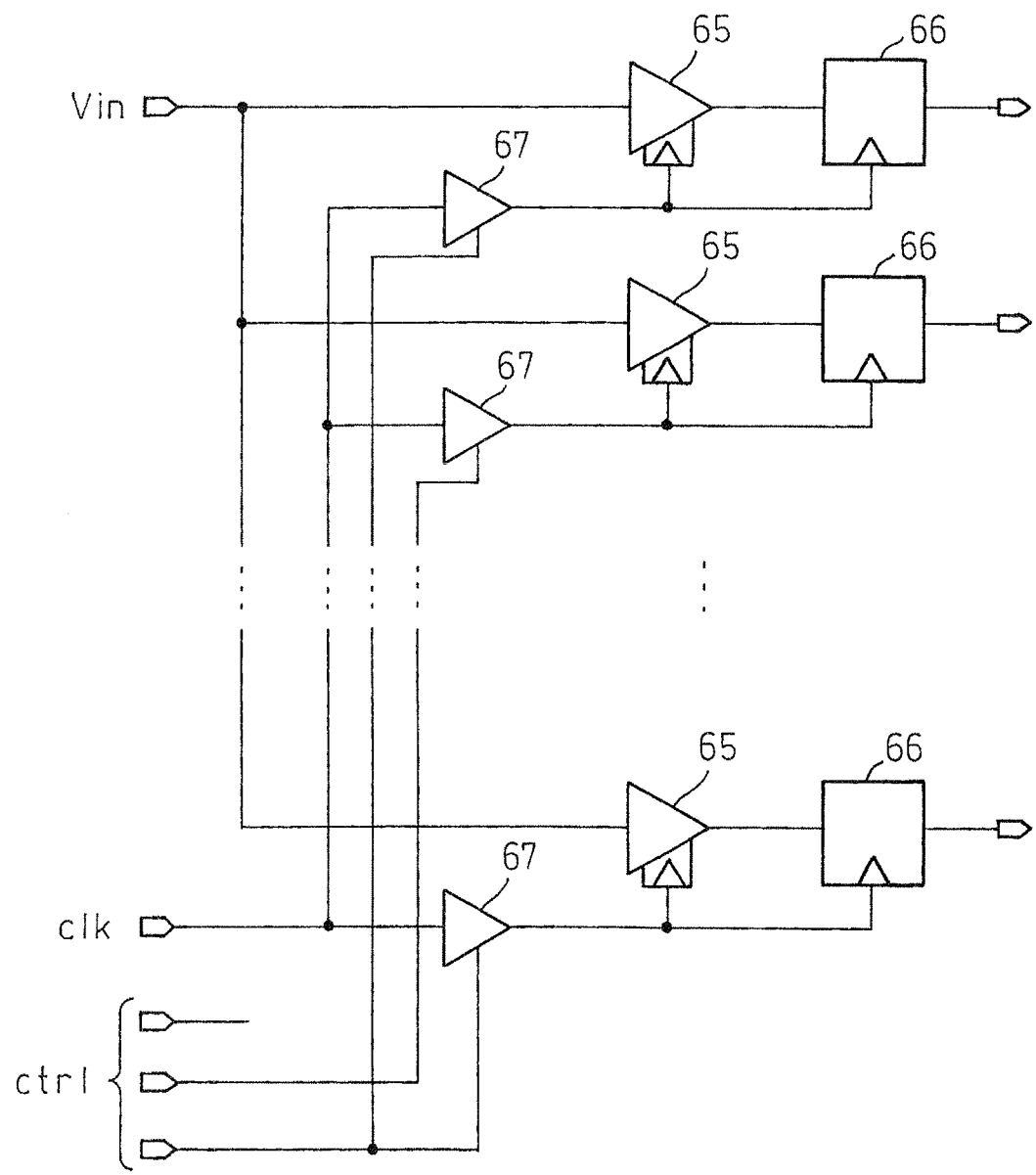
FIG. 13 is a diagram illustrating a configuration of an ADC core of an ADC in the third embodiment.

As described above, the comparator 49 includes an amplifier that amplifies an input signal. FIG. 13 is a diagram illustrating a configuration of the comparator in the third embodiment. Each comparator 49 has an amplifier 65 that amplifies an input signal Vin, a core comparator 66 that compares the output of the amplifier with a divided potential, and a clock buffer 67 that controls the supply of a clock clk to the amplifier 65 and the core comparator 66. For the sake of simplification of the figure, the divided potential generated by the ladder resistor is not illustrated schematically. This also applies to the subsequent figures. The amplifier 65 and the core comparator 66 operate in synchronization with the clock clk and when the supply of the clock clk is terminated, they are brought into the non-operating state and the output is fixed. Due to this, the switching operation is terminated, and therefore, the power consumption is reduced. The clock buffer 67 is controlled whether or not to output the clock clk by the N-bit adjustment signal ctrl from the control circuit 63.

As illustrated in FIG. 12, when the three bits are valid, the eight comparators C1, C3, C5, C7, C9, C11, C13 and C15 are brought into the non-operating state, and therefore, these may be adjusted by the common adjustment signal ctrl. Similarly, the four comparators C2, C6, C10 and C14 may be adjusted by the common adjustment signal ctrl, and two comparators C4 and C12 may be adjusted by the common adjustment signal ctrl, however, the comparator C8 does not need to be adjusted.

Figure 14:
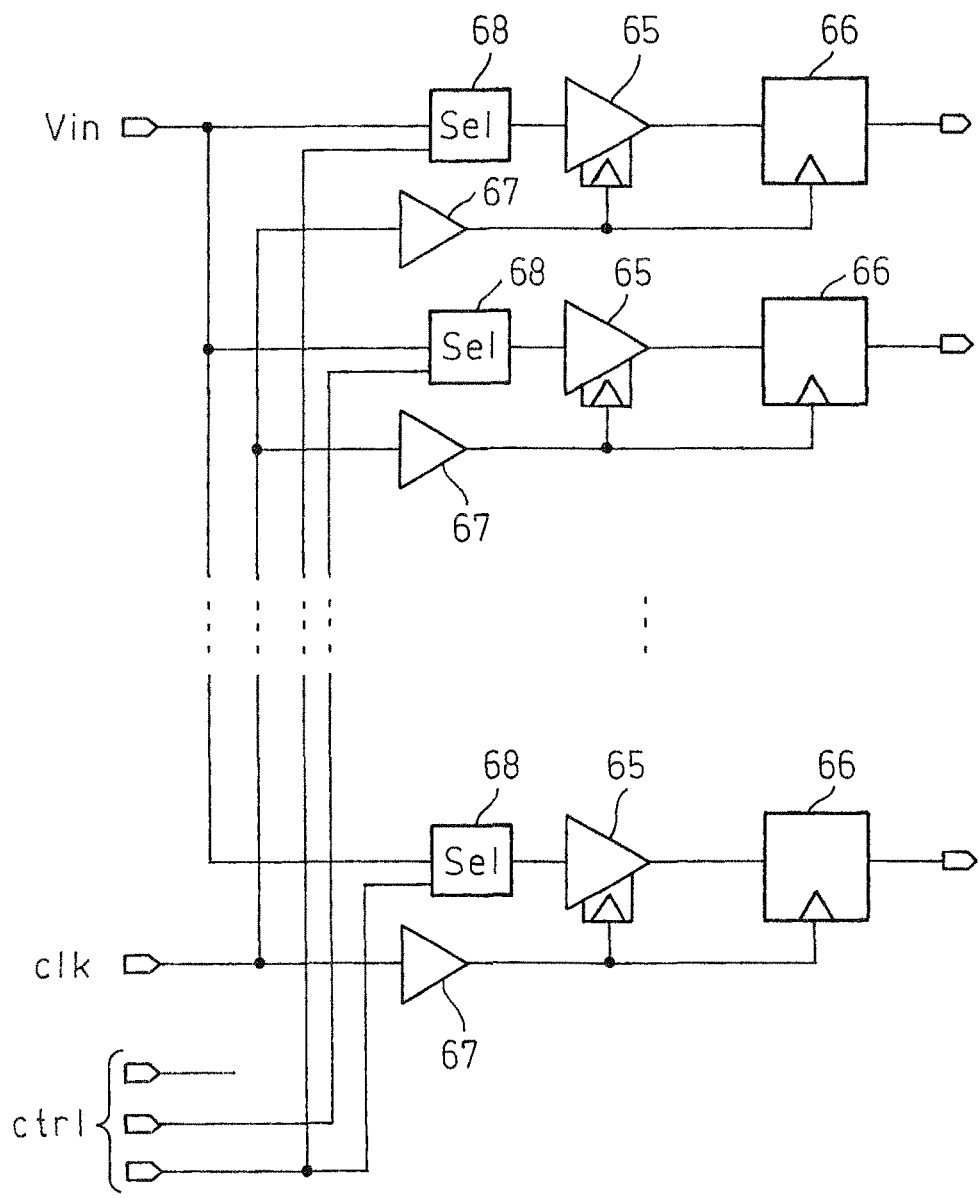
FIG. 14 is a diagram illustrating another example of a configuration of an ADC core of an ADC in the third embodiment.

In the comparator 49 in the third embodiment, the clock buffer 67 that supplies the clock clk to the amplifier 65 and the core comparator 66 is controlled; however, it is also possible to bring the amplifier 65 and the core comparator 66 into the non-operating state by providing a selector 68 in the previous stage of the amplifier 65 and by switching a signal to be supplied to the amplifier 65 to a constant voltage as illustrated in FIG. 14. The selector 68 may be realized by, for example, a transfer gate or NAND gate, and is adjusted by the adjustment signal ctrl.

Figure 15:
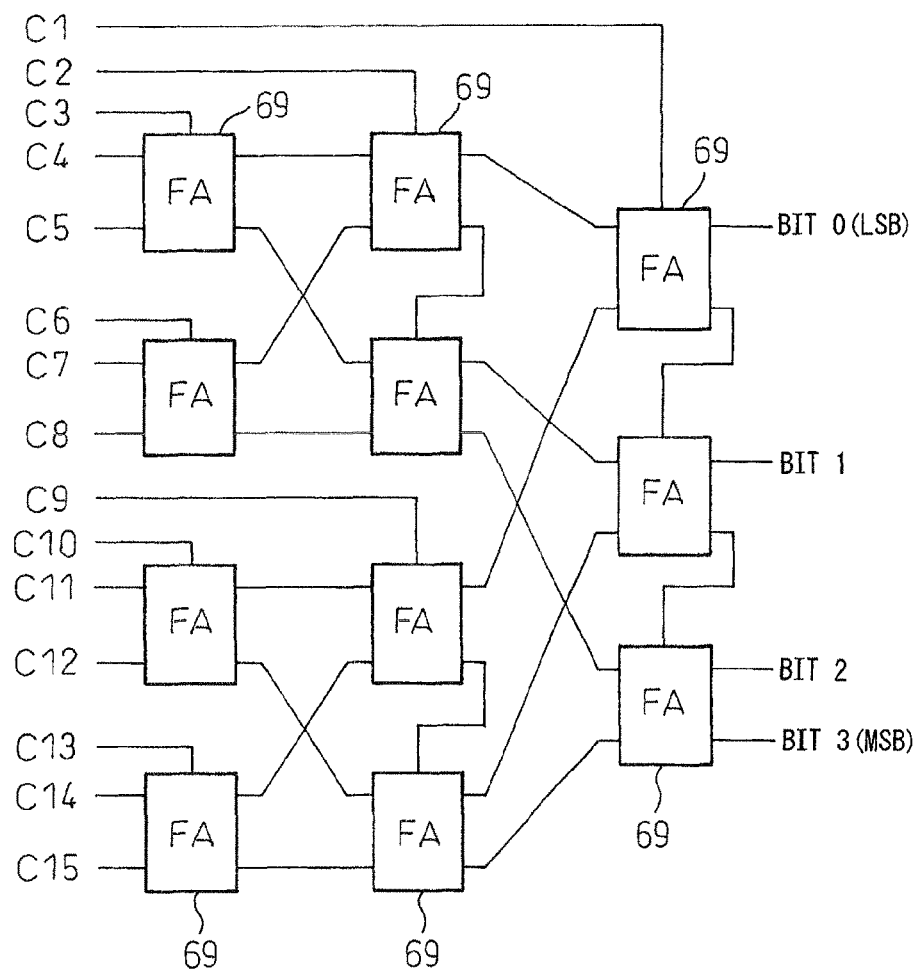
FIG. 15 is a diagram illustrating a configuration of an encoder of an ADC in the third embodiment.

When reducing the number of bits by bringing part of the plurality of the comparators 49 into the non-operating state as described above, it is desirable to use the encoder (Wallace-tree encoder) described in non-patent document 1, which performs encode processing by counting the number of "1's". FIG. 15 is a diagram illustrating the circuit configuration of the encoder. In FIG. 15, FA 15 denotes a full adder that receives input data as well as a carry input and outputs the addition result together with a carry. The encoder is widely known as described in non-patent document 1, and therefore, detailed explanation is omitted.

In the ADC 31, when the valid bits are changed, in FIG. 12, the change is made by a method in which the comparators to be brought into the non-operating state are thinned; however, it is also possible to bring the comparators on both sides into the non-operating state as illustrated in FIG. 16. Specifically, when four bits are valid, all of the 15 comparators C1 to C15 are in the operating state, when three bits are valid, the comparators C1 to C4 and C12 to C15 are brought into the non-operating state and then the comparators C5 to C11 are brought into the operating state, when two bits are valid, the comparators C1 to C6 and C10 to C15 are brought into the non-operating state and the comparators C7 to C9 are brought into the operating state, and when one bit is valid, only the comparator C7 may be brought into the operating state.

In the example in FIG. 16, the comparators on both sides are brought into the non-operating state; however, it may also be possible to bring the comparators into the non-operating state in order from one of the sides.

When the error value is smaller than the threshold value, the control circuit 63 determines that no problem will arise even if the amount of error increases and controls so that the number of valid bits of the ADC core 57 decreases, and when the error value is larger than the threshold value, the control circuit 63 controls so that the number of valid bits of the ADC core 57 increases. This processing is repeated and the feedback control is made so that the number of valid bits of the ADC core 57 is as small as possible in the range in which the error value is equal to or less than the threshold value. When the number of valid bits of the ADC core 57 decreases, the number of gates to be switched decreases and the power consumption is also reduced.

Figure 17:
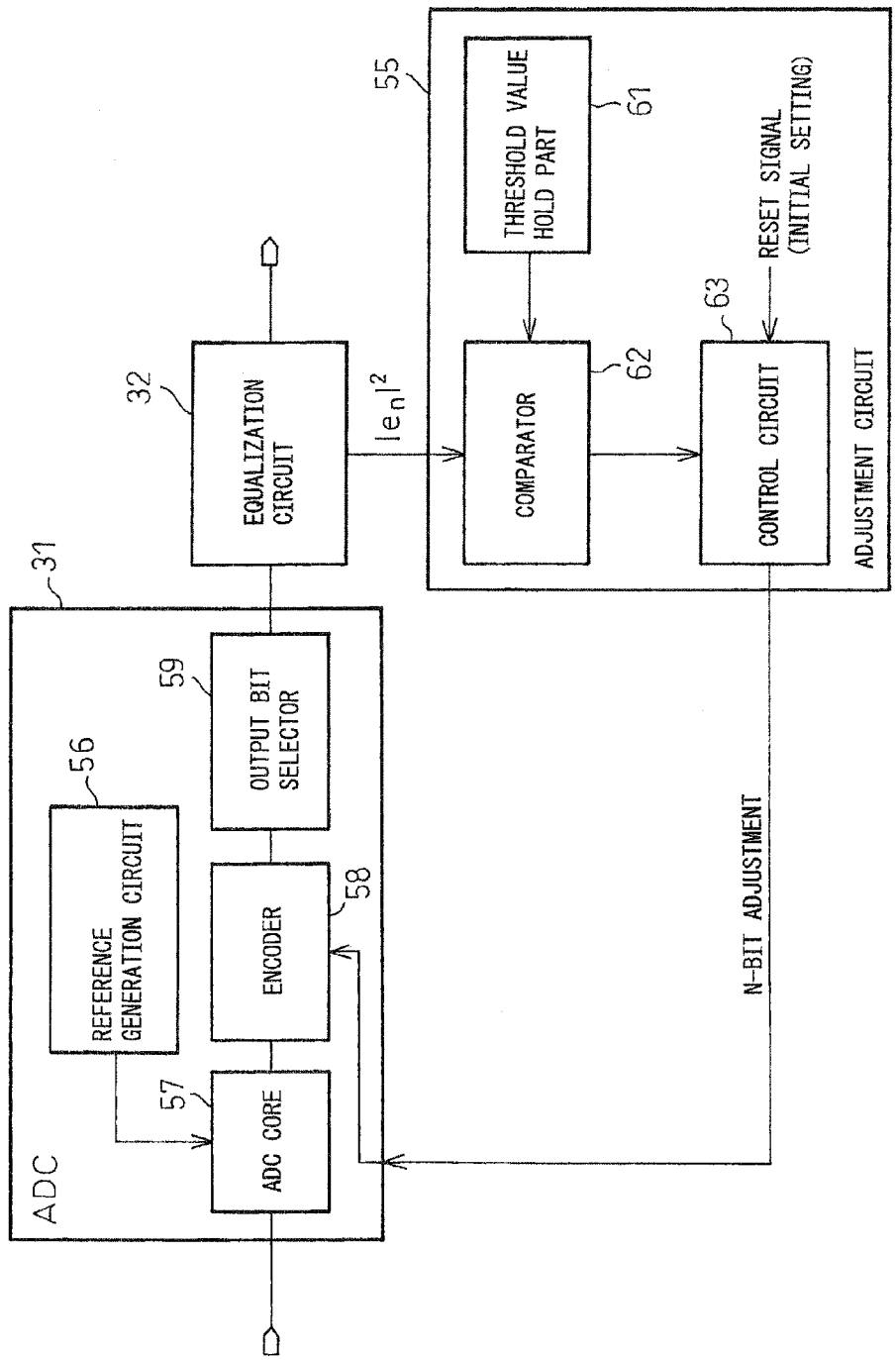
FIG. 17 is a diagram illustrating a configuration of a reception circuit in a signal transfer system in a fourth embodiment.

A signal transfer system in a fourth embodiment has the basic configuration as illustrated in FIG. 7. FIG. 17 is a block diagram illustrating a configuration of the reception circuit 3 in the fourth embodiment. As illustrated in FIG. 10, in the third embodiment, the control circuit 63 changes the precision (resolution) by controlling the number of operation bits of the ADC core 57; however, the fourth embodiment differs from the third embodiment in that the precision (resolution) is changed by adjusting the number of operation bits of the encoder 58 and the other parts, including control, are the same.

Figure 18:
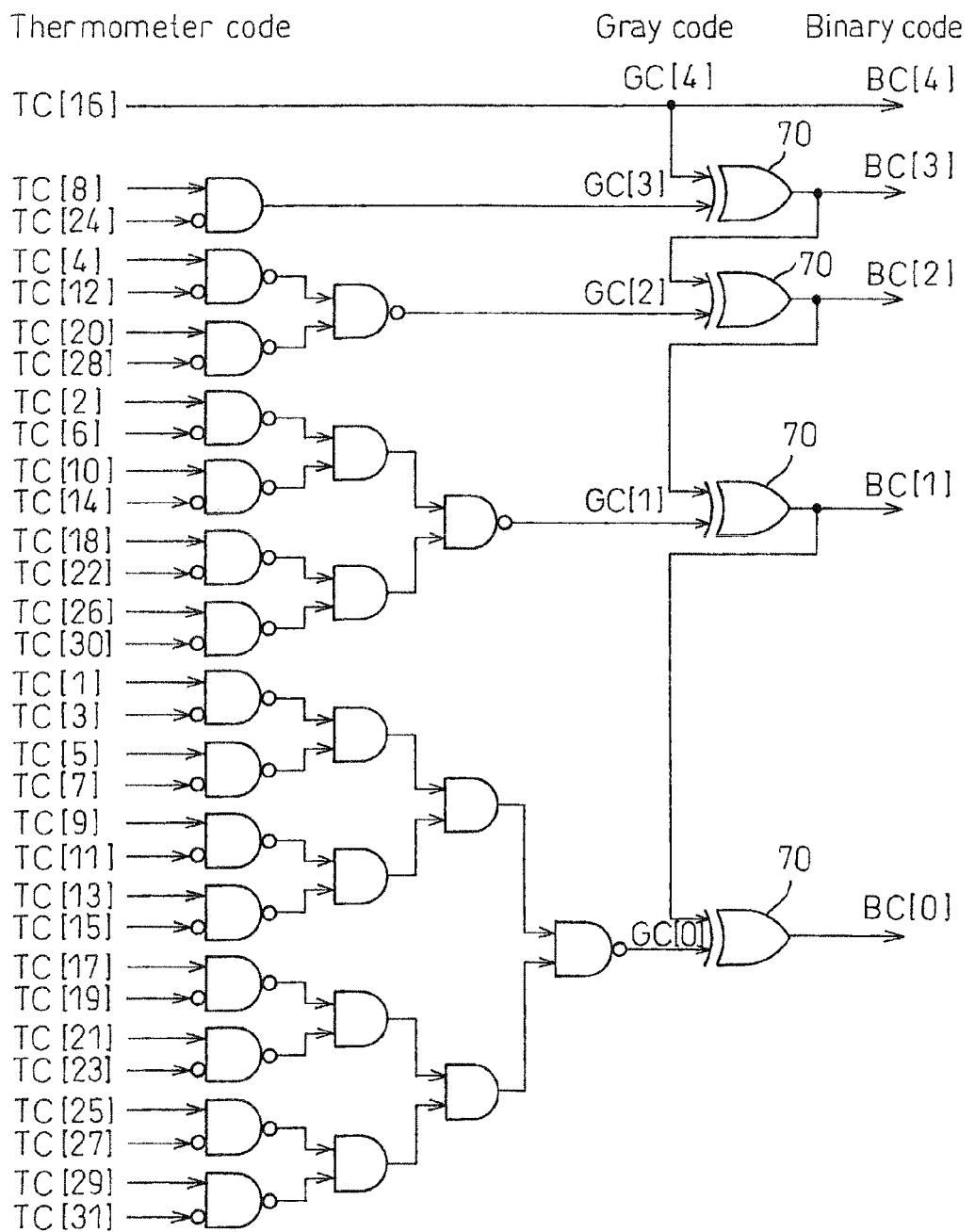
FIG. 18 is a diagram illustrating a configuration of a conventional 5-bit encoder (FAT-tree encoder).
Figure 19:
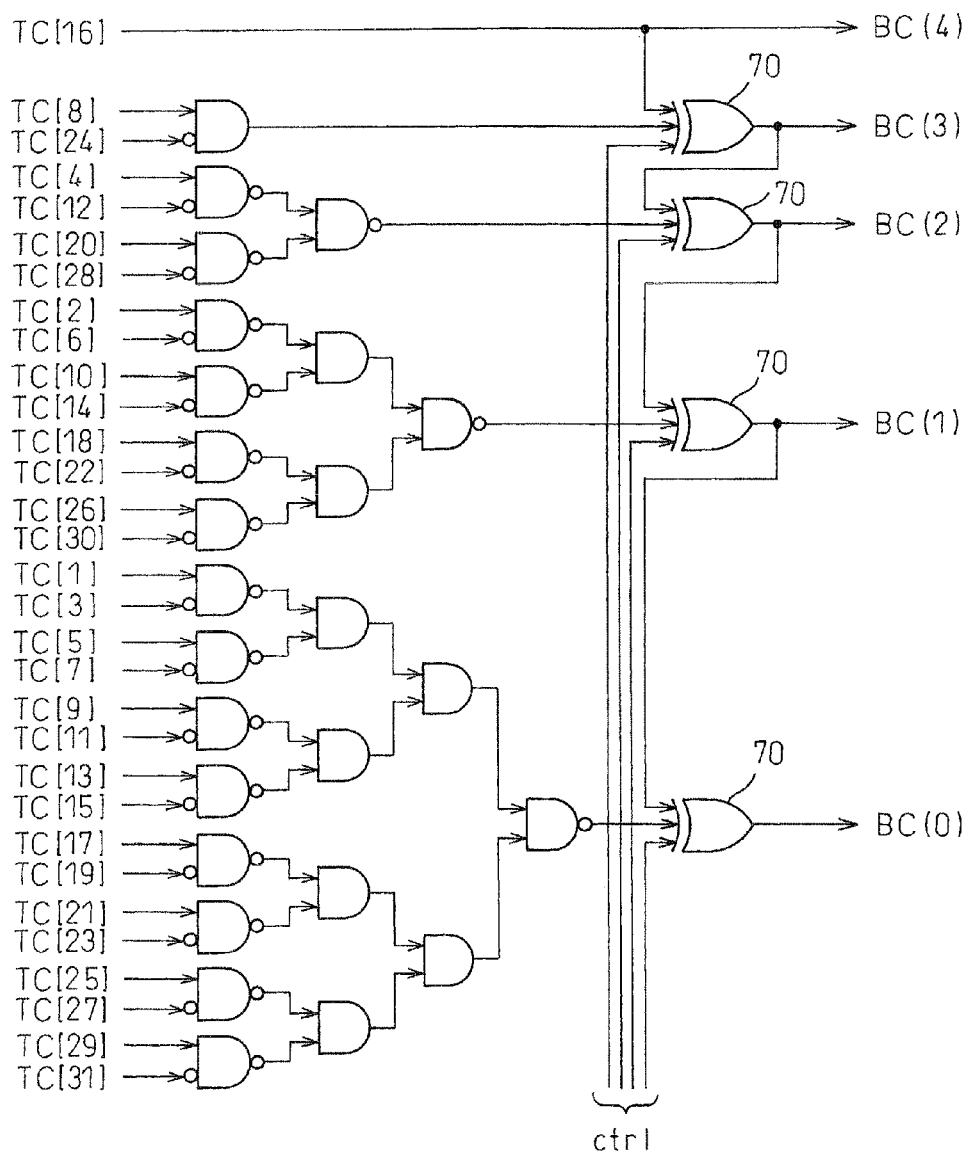
FIG. 19 is a diagram illustrating a configuration of an encoder of an ADC in the fourth embodiment.

FIG. 18 is a diagram illustrating a configuration of a conventional 5-bit encoder (FAT-tree encoder) widely used. The reception circuit 3 in the fourth embodiment uses an encoder illustrated in FIG. 19. The encoder in FIG. 19 is configured to fix the output of an EXOR gate 70 in the final stage of the encoder in FIG. 18 to a constant value by the control signal ctrl. For example, when the output of the ADC is in order of 10101 from MSB toward LSB, a low order 1 bit is clipped to "0" so that the output is 10100. Due to this, high order 4 bits are used effectively and the lowest order bit is fixed at "0", and therefore, data transition does not occur and thus the power consumption may be reduced. It may also be possible to provide a selector at the output part using the encoder in FIG. 15 instead of the encoder (FAT-tree encoder) in FIG. 19.

Figure 20:
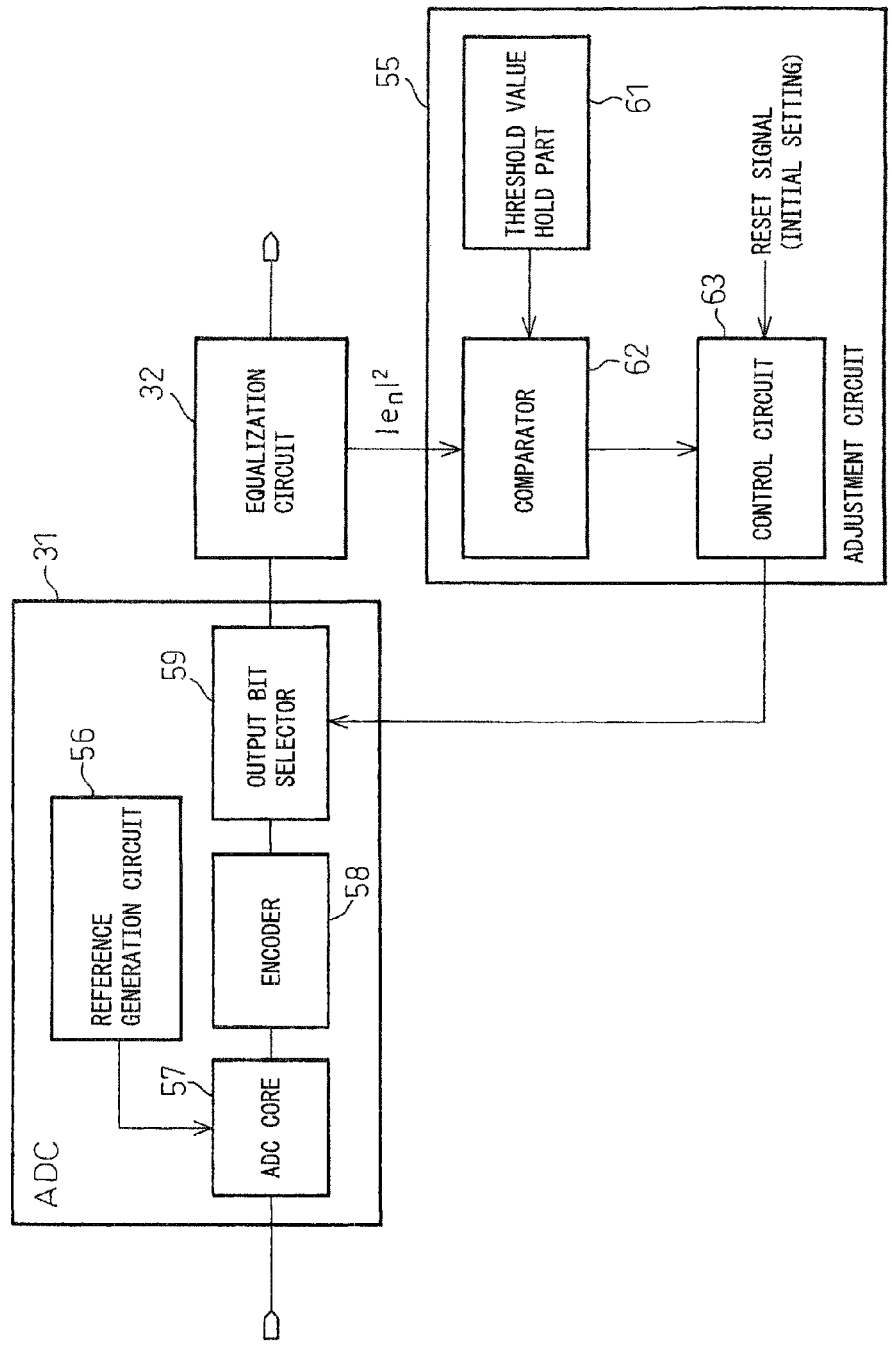
FIG. 20 is a diagram illustrating a configuration of a reception circuit in a signal transfer system in a fifth embodiment.

A signal transfer system in a fifth embodiment has the basic configuration as illustrated in FIG. 7. FIG. 20 is a block diagram illustrating a configuration of the reception circuit 3 in the fifth embodiment. The ADC 31 in the fifth embodiment differs from that in the third and fourth embodiments in that an output bit selector 59 is provided in the post stage of the encoder 58 and the other parts, including control, are the same.

Figure 21:
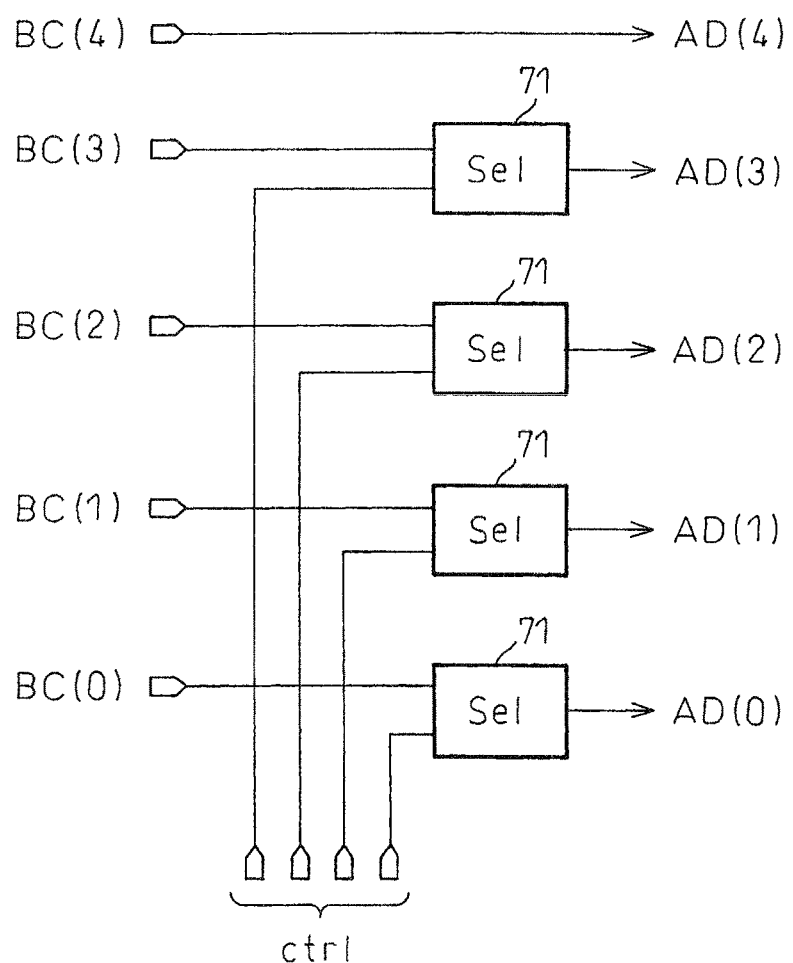
FIG. 21 is a diagram illustrating a configuration of an output bit selector in the fifth embodiment.

FIG. 21 is a diagram illustrating a configuration of the output bit selector 59. As illustrated in FIG. 21, the output bit selector 59 has a plurality of selectors (SEL) 71 provided for each bit signal except for the highest order bit of the bit signals output from the encoder 58. FIG. 21 illustrates the case of a 5-bit ADC and the four selectors (SEL) 71 are provided. The effect of the fifth embodiment is the same as that of the fourth embodiment.

Figure 22:
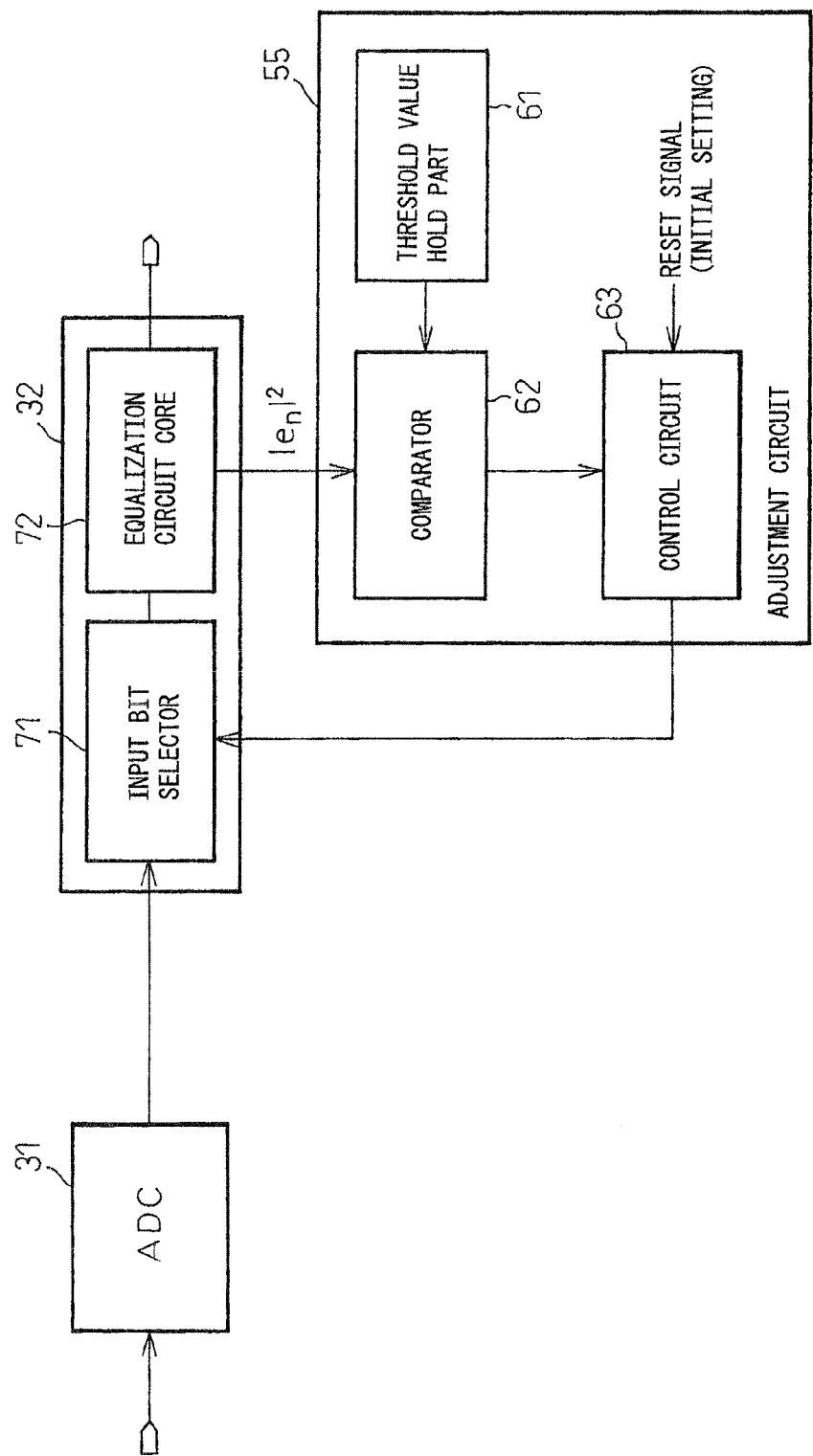
FIG. 22 is a diagram illustrating a configuration of an modified example of a reception circuit in a signal transfer system in the fifth embodiment.

In the fifth embodiment, in the ADC 31, the output bit selector 59 is provided in the post stage of the encoder 58 and thus it is made possible to adjust the number of output bits of the ADC; however, as illustrated in FIG. 22, it is also possible to enable the control of the number of bits of the ADC 31 to be input to an equalization circuit core 72 by providing the input bit selector 71 at the input part of the equalization circuit 32. In this case, the same effect as that of the fourth embodiment may be also obtained.

Figure 23:
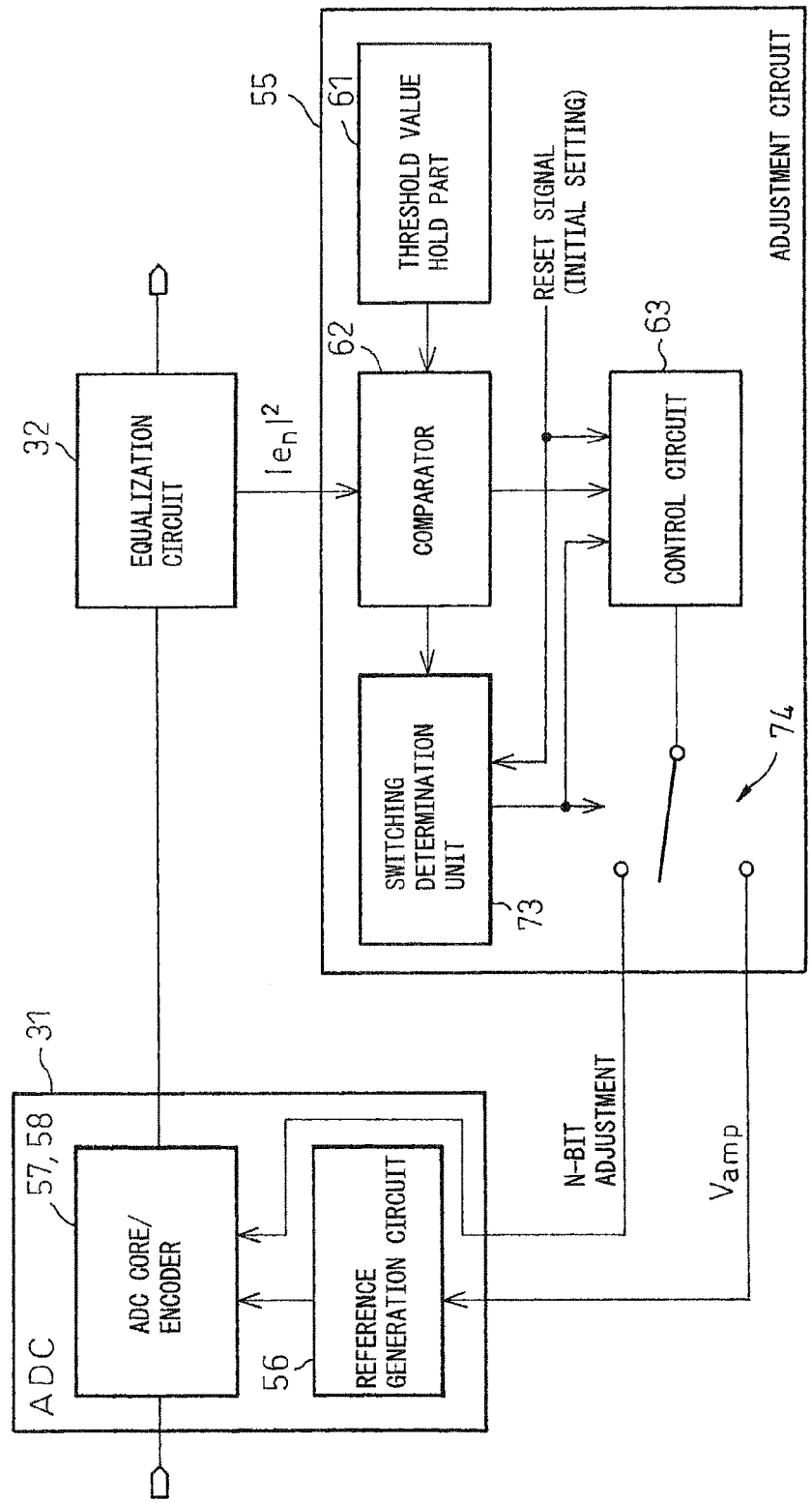
FIG. 23 is a diagram illustrating a configuration of a reception circuit in a signal transfer system in a sixth embodiment.

A signal transfer system in a sixth embodiment has the basic configuration as illustrated in FIG. 7. FIG. 23 is a block diagram illustrating a configuration of the reception circuit 3 in the sixth embodiment. In the reception circuit 3 in the sixth embodiment, the precision (resolution) and the input quantization range of the ADC 31 are adjusted alternately.

The adjustment circuit 55 in the sixth embodiment has the configuration of the adjustment circuit 55 in the second to fifth embodiments, in which a switching determination unit 73 and a switching switch 74 are further provided. The switching determination unit 73 controls the switching switch 74 in accordance with the comparison result of the comparator 62 and switches between supplying the control signal output from the control circuit 63 to the reference generation circuit 56 of the ADC 31 and supplying it to the ADC core 57 and the encoder 58. The control circuit 63 outputs a control signal Vamp to control the input quantization range when the switching switch 74 is connected to the reference generation circuit 56 and outputs the (N-bit adjustment) control signal to adjust the precision (resolution) when the switching switch 74 is connected to the ADC core 57 and the encoder 58.

Figure 24:
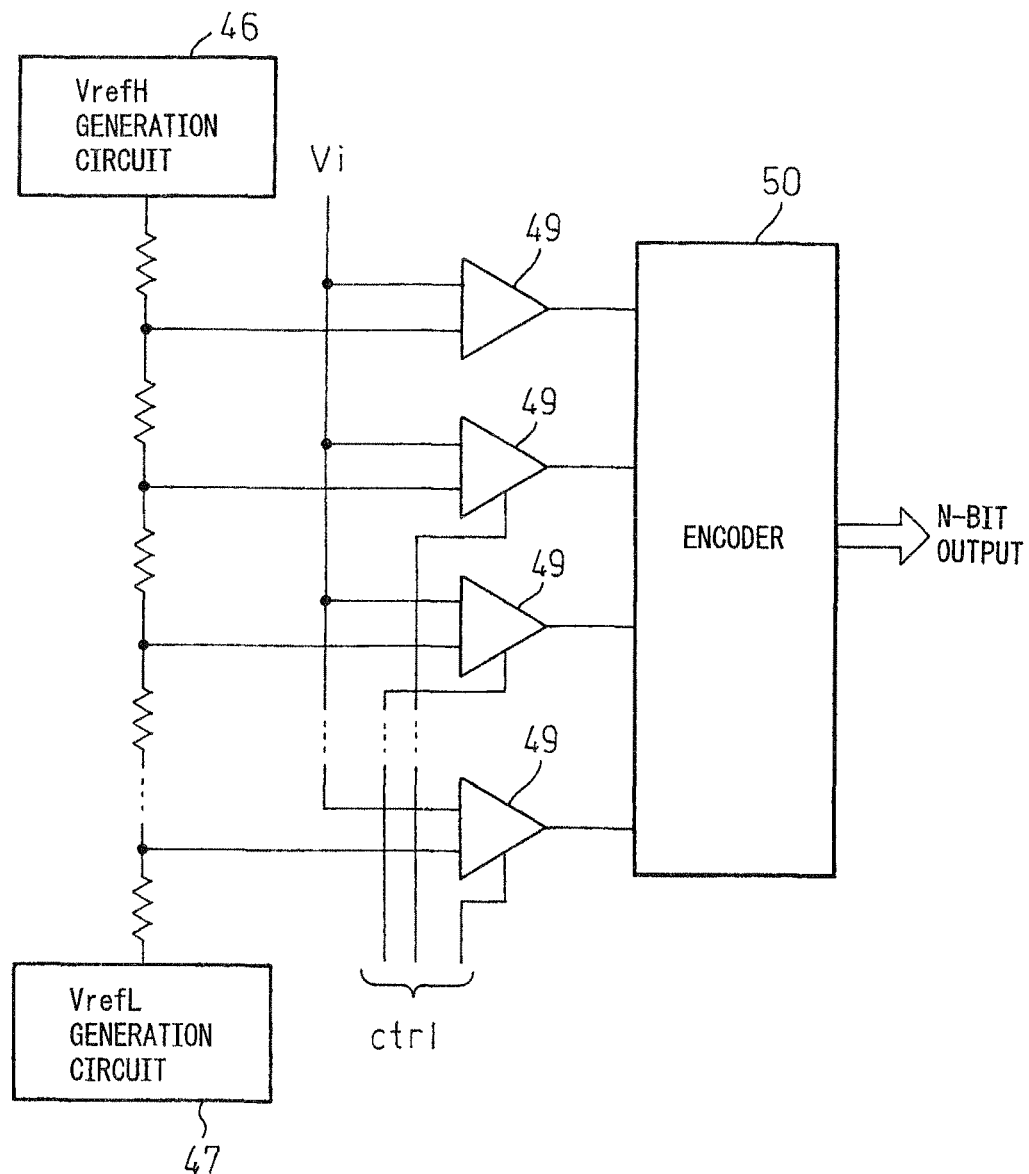
FIG. 24 is a diagram illustrating an ADC in the sixth embodiment.

FIG. 24 is a diagram illustrating a configuration of the ADC 31 in the sixth embodiment. The ADC 31 in the sixth embodiment has the configuration of the ADC 31 in the third embodiment in FIG. 11, in which the VrefH generation circuit 46 that may change VrefH to be generated and the VrefL generation circuit 47 that may change VrefL to be generated are further provided. The comparator 49 is the same as that in the third embodiment, and therefore, an explanation is omitted. Further, the method of controlling the VrefH generation circuit 46 and the VrefL generation circuit 47 by the control circuit 63 is the same as that in the second embodiment, and therefore, an explanation is omitted.

Figure 25:
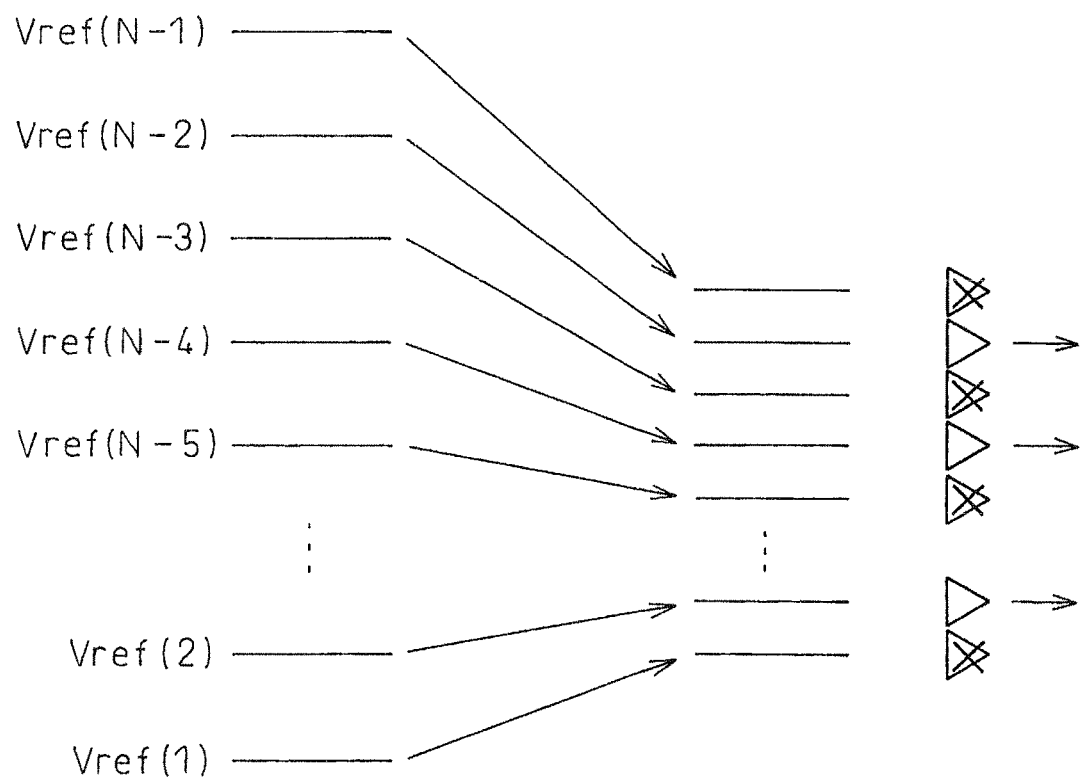
FIG. 25 is a diagram explaining the reduction in the input quantization range and resolution (number of bits) of an ADC in the sixth embodiment.

In the ADC 31 in the sixth embodiment, both the precision (resolution) and the input quantization range of the ADC 31 are adjusted. FIG. 25 is a diagram explaining the adjustment of the ADC 31 in the sixth embodiment. When making adjustment, first VrefH is set to the maximum value and VrefL to the minimum value and the precision is also set to the maximum state, i.e., all of the N bits are made valid. At this time, divided potentials Vref (1) to Vref (N−1) are as illustrated on the left-hand side in FIG. 25. Next, in order to reduce the input quantization range, VrefH is lowered and VrefL is raised. Due to this, the divided potentials Vref (1) to Vref (N−1) change as illustrated in the center in FIG. 25, i.e., Vref (1) is raised and Vref (N−1) is lowered and the intervals between neighboring divided potentials are reduced. Next, the number of valid bits is reduced and thus the precision (resolution) is lowered. In FIG. 25, the case is illustrated where the number is lowered by one bit by brining every two comparators into the non-operating state. If the input quantization range is reduced to ½ and the number of valid bits is lowered by one bit, the intervals of the divided potentials referred to by the comparators the output of which is valid are the same as those in the initial state. In other words, the case is the same as that where half of the total comparators including those on the upper side and on the lower side are invalidated.

In the above-mentioned example, the number of valid bits of the ADC core 57 is adjusted; however, it may also be possible to adjust the number of output bits of the encoder as in the fourth embodiment or to adjust the number of output bits by providing the output bit selector as in the fifth embodiment.

Figure 26:
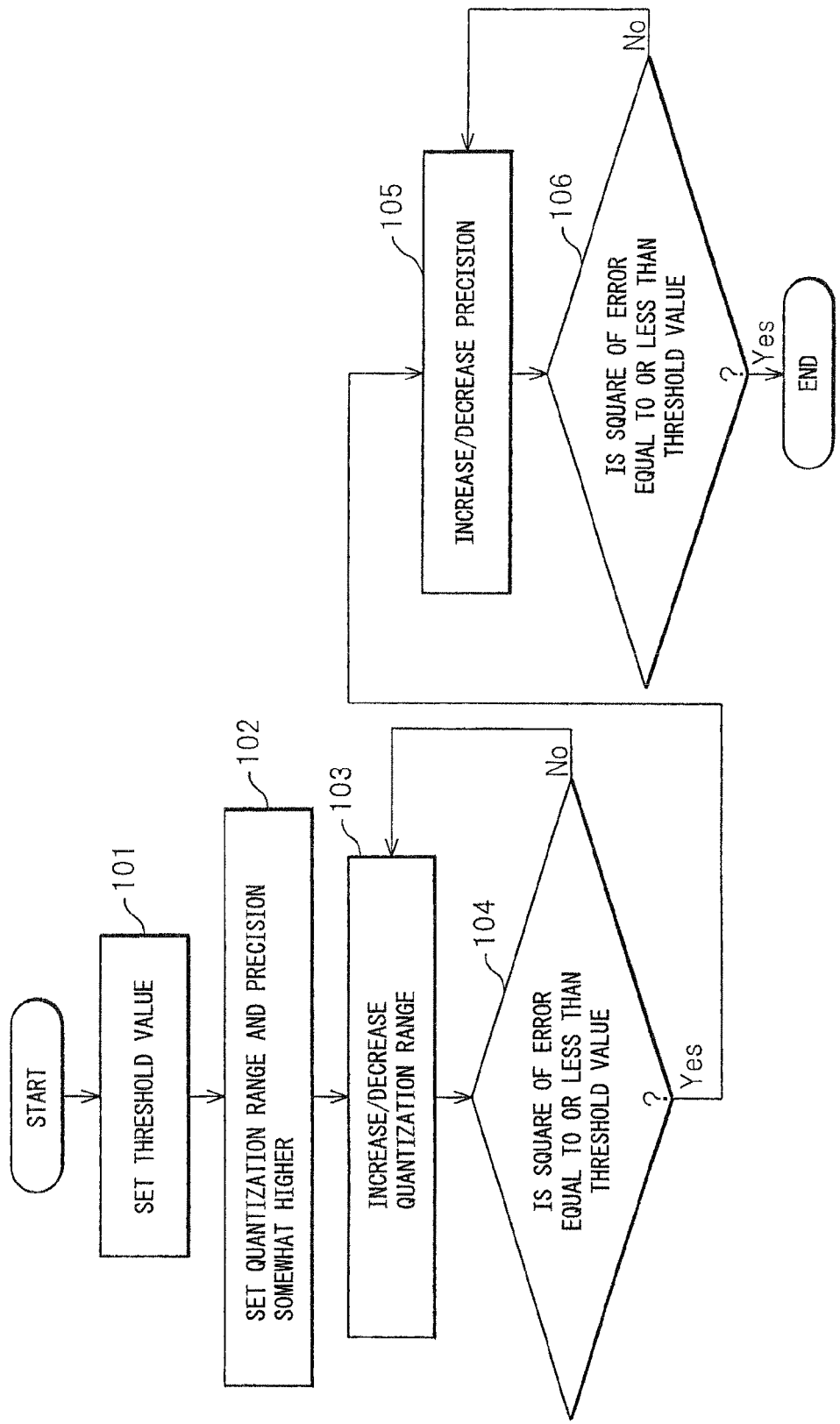
FIG. 26 is a flowchart illustrating adjustment processing of the input quantization range and resolution (number of bits) of an ADC in a reception circuit in the sixth embodiment.

FIG. 26 is a flowchart illustrating adjustment processing in the sixth embodiment.

In step 101, a threshold value is set to the threshold value hold part 61.

In step 102, the input quantization range and the precision (resolution), i.e., the number of valid bits of the ADC, are set somewhat higher.

In step 103, the input quantization range is increased/decreased.

In step 104, whether the square value of the error (error value) is equal to or less than the threshold value is determined in the increased/decreased input quantization range. When not equal to or less than the threshold value, the processing returns to step 103. By repeating steps 103 and 104, the quantization range is set so that the square value of error (error value) is in the vicinity of the threshold value.

In step 105, the precision of the ADC, i.e., the number of valid bits of the ADC is increased/decreased.

In step 106, whether the square value of error (error value) is equal to or less than the threshold value with the increased/decreased number of bits is determined. If not equal to or less than the threshold value, the processing is returned to step 105. By repeating steps 105 and 106, the number of valid bits of the ADC is set so that the square value of error (error value) is in the vicinity of the threshold value.

In the flowchart in FIG. 26, it is also possible to exchange the steps 103 and 104, and 105 and 106 and set the number of valid bits of the ADC first, and then set the quantization range.

Figure 27:
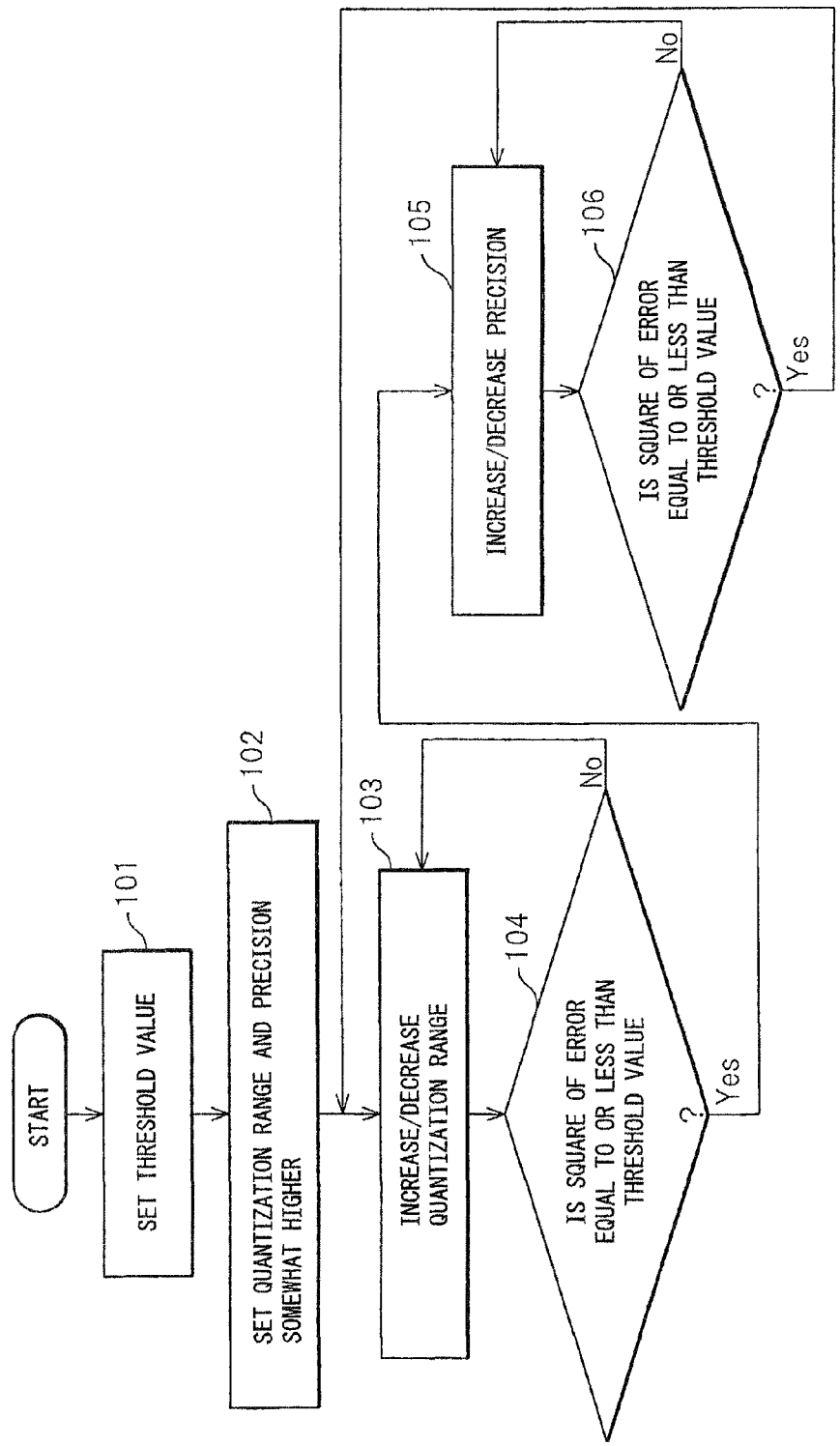
FIG. 27 is a flowchart illustrating another adjustment processing of the input quantization range and resolution (number of bits) of an ADC in a reception circuit in the sixth embodiment.

In the adjustment processing illustrated in the flowchart in FIG. 26, adjustment may be made only once during a specific period of time; however, as illustrated in the flowchart in FIG. 27, if it is designed so that the processing is returned to step 103 when "Yes" in step 106, adjustment may be always made so that the quantization range and the precision (resolution) of the ADC is optimized. Due to this, it is possible to maintain the ADC 31 in the optimum state at all the times even when the state of the transfer line 2 changes, etc.

Often the error value changes more when the quantization range is changed than when the number of bits is changed. Because of this, the quantization range may be set so that there is a certain margin between the error value and the threshold value and then the error value may be set so as to be equal to or less than the threshold value by changing the number of bits.

In the second to sixth embodiments, basically, the adjustment is made at all times. Depending on the application of the signal transfer system, it is desired to adjust the quantization range and precision (resolution) of the ADC and maintain the adjusted state when specified by a user. A signal transfer system in a seventh embodiment to be explained next is a system that satisfies this demand.

Figure 28:
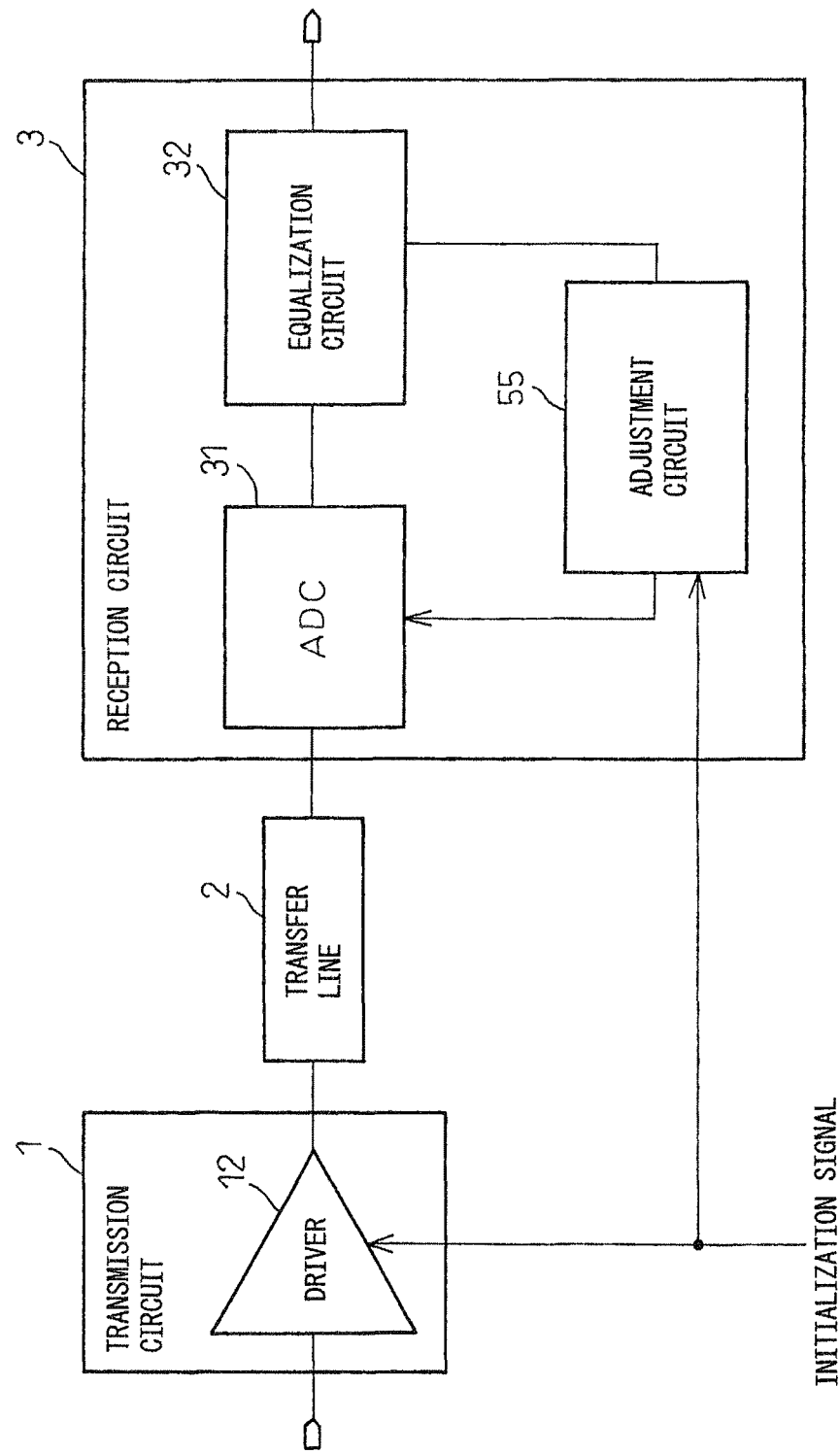
FIG. 28 is a diagram illustrating a configuration of a signal transfer system in a seventh embodiment.

FIG. 28 is a block diagram illustrating a configuration of a signal transfer system in a seventh embodiment. The signal transfer system in the seventh embodiment has the same configuration as the basic configuration of the signal transfer system of the first embodiment illustrated in FIG. 7, and the driver 12 and the adjustment circuit 55 have an input terminal of an initialization signal. When an initialization signal is input, the driver 12 outputs transmission data of an initialization pattern and the adjustment circuit 55 performs adjustment processing of the quantization range and precision (resolution) of the ADC 31.

In the signal transfer systems in the second to seventh embodiments, the feedback control is made by changing at least one of the quantization range and the precision (resolution) of the ADC 31 to reduce the power consumption in the range where the error value from the equalization circuit 32 is equal to or less than the threshold value; however, in a signal transfer system in an eighth embodiment to be explained next, a table is used to determine the quantization range and the precision of the ADC 31.

Figure 29:
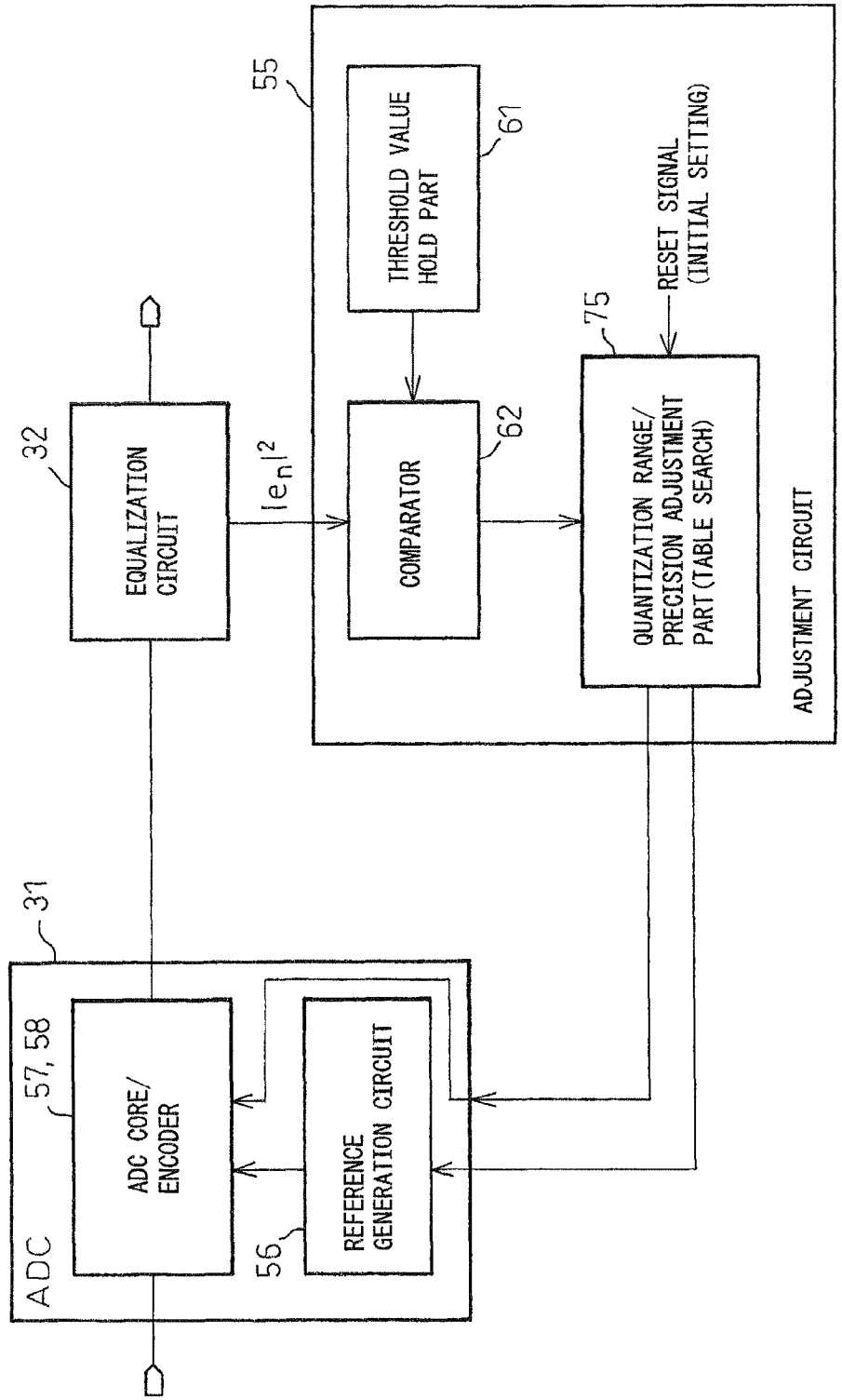
FIG. 29 is a diagram illustrating a configuration of a reception circuit in a signal transfer system in an eighth embodiment.

The signal transfer system in the eighth embodiment has the basic configuration as illustrated in FIG. 7. FIG. 29 is a block diagram illustrating a configuration of the reception circuit 3 in the eighth embodiment. In the reception circuit 3 in the eighth embodiment, as in the sixth embodiment, the precision (resolution) and the quantization range of the ADC 31 are adjusted. The adjustment circuit 55 includes the threshold value hold part 61, the comparator 62, and a quantization range/precision adjustment part 75. The quantization range/precision adjustment part 75 has a table that stores in advance a relationship between the error value and the quantization range and the precision (number of bits).

FIG. 30 is a diagram explaining a configuration example of the table in the eighth embodiment. As illustrated in FIG. 30, in the table, quantization ranges in five steps are listed in the leftmost column and the numbers of bits of ADC to be validated (up to 6 bits, here) are listed in the uppermost row and each box stores an amount of error with which an accurate data determination may be made under the conditions corresponding to the quantization range and the number of bits. The minimum error value corresponds to the first step of the quantization range and the number of bits 1, and the maximum error value corresponds to the sixth step of the quantization range and the number of bits 6. For example, an error value of 1.3E-01 appears in the box where the quantization range is the first step and the number of bits is 4, in the box where the quantization range is the second step and the number of bits is 3, and in the box where the quantization range is the fifth step and the number of bits is 2. In this manner, a certain error value appears in the boxes substantially on a line that extends from the upper-right toward the bottom-left in the table. Because of this, for a certain error value, the characteristics and the power consumption of a system are taken into consideration and then an appropriate box on the line is selected and adjustment is initiated based on the conditions. Due to this, it is possible to shorten the time desired for the adjustment to converge, i.e., the adjustment time.

Figure 31:
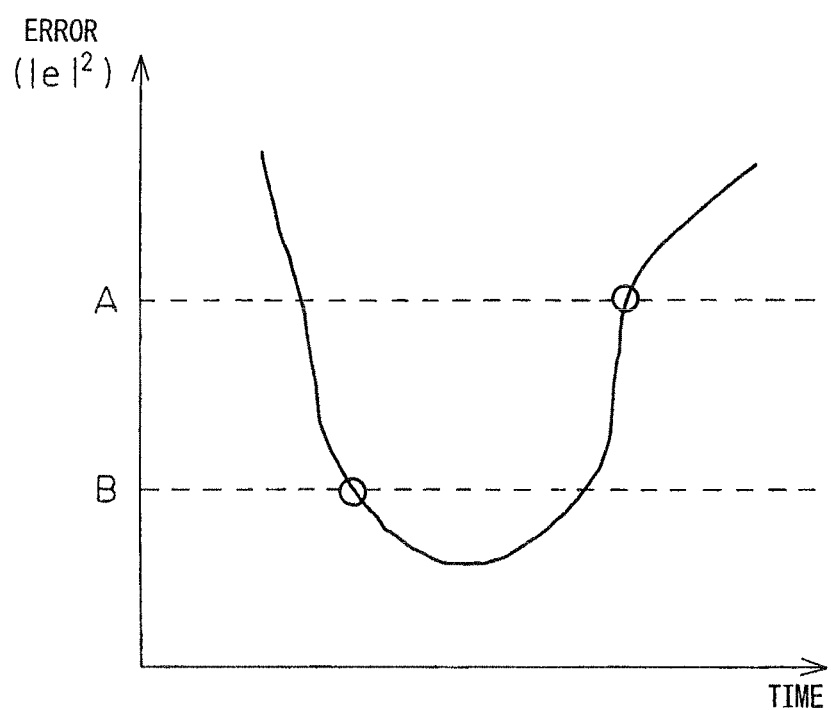
FIG. 31 is a diagram illustrating a configuration in which two threshold values are provided.

In the embodiments explained above, it may also be possible to prepare a plurality of threshold values to be held in the threshold value hold part 61. In the embodiments explained above, at least one of the quantization range and the number of bits of the ADC is changed, however, there is a delay in time after the ADC is changed until the error value changes. For example, it is assumed that the error value (error) is reduced in accordance with the change of the ADC, as illustrated in FIG. 31. In FIG. 31, if a threshold value is set to a level denoted by B, when the error value falls below the threshold value B, the quantization range or the number of bits is changed so that the power consumption is reduced. However, the error value increases because of the change, and therefore, when the error value exceeds the threshold value B, the quantization range or the number of bits is changed so as to increase so that the error value falls below the threshold value B. Next, the error value falls again below the threshold value B due to the change, and therefore, the quantization range or the number of bits is changed so as to decrease, and this processing is repeated afterward. As described above, there arises a problem that the quantization range or the number of bits is changed frequently.

Because of this, as illustrated in FIG. 31, another threshold value A is set and the threshold value A is used when the change is made so that the error value decreases and the threshold value B is used when the change is made so that the error value increases. In other words, the hysteresis characteristic is given to the threshold value. Due to this, it is possible to avoid the situation in which the quantization range or the number of bits is changed frequently. Further, by changing the ADC so that error value may increase only when the error value is sufficiently small, it is possible to suppress the error value from increasing too much.

In the embodiments explained above, the error value is used to evaluate the reproduction state of a received signal; however, in a ninth embodiment to be explained next, the reproduction state of a received signal is evaluated using a coefficient of the multiplier of the equalization circuit 32 and then the quantization range and the precision (resolution) of the ADC are adjusted.

The coefficient of the equalization circuit corresponds to the transfer characteristic of the transfer line. The transfer characteristic of the transfer line is estimated in advance by a simulation and a coefficient of the equalization circuit in accordance therewith is stored. If an actual coefficient of the equalization circuit when performing processing to optimize the equalization circuit in accordance with an input signal is different from the stored coefficient, it may be thought that the actual transfer characteristic of the transfer line is different from the estimated transfer characteristic or the difference results from an error of the ADC. Because of this, when the actual coefficient is better than a certain stored coefficient, for example, when the coefficients other than $c_n0$ are small, the actual transfer characteristic may be thought better than the estimated transfer characteristic, and therefore, it may be thought that the waveform may be reproduced with sufficient quality even if the input quantization range and the number of bits of the ADC are reduced.

Figure 32:
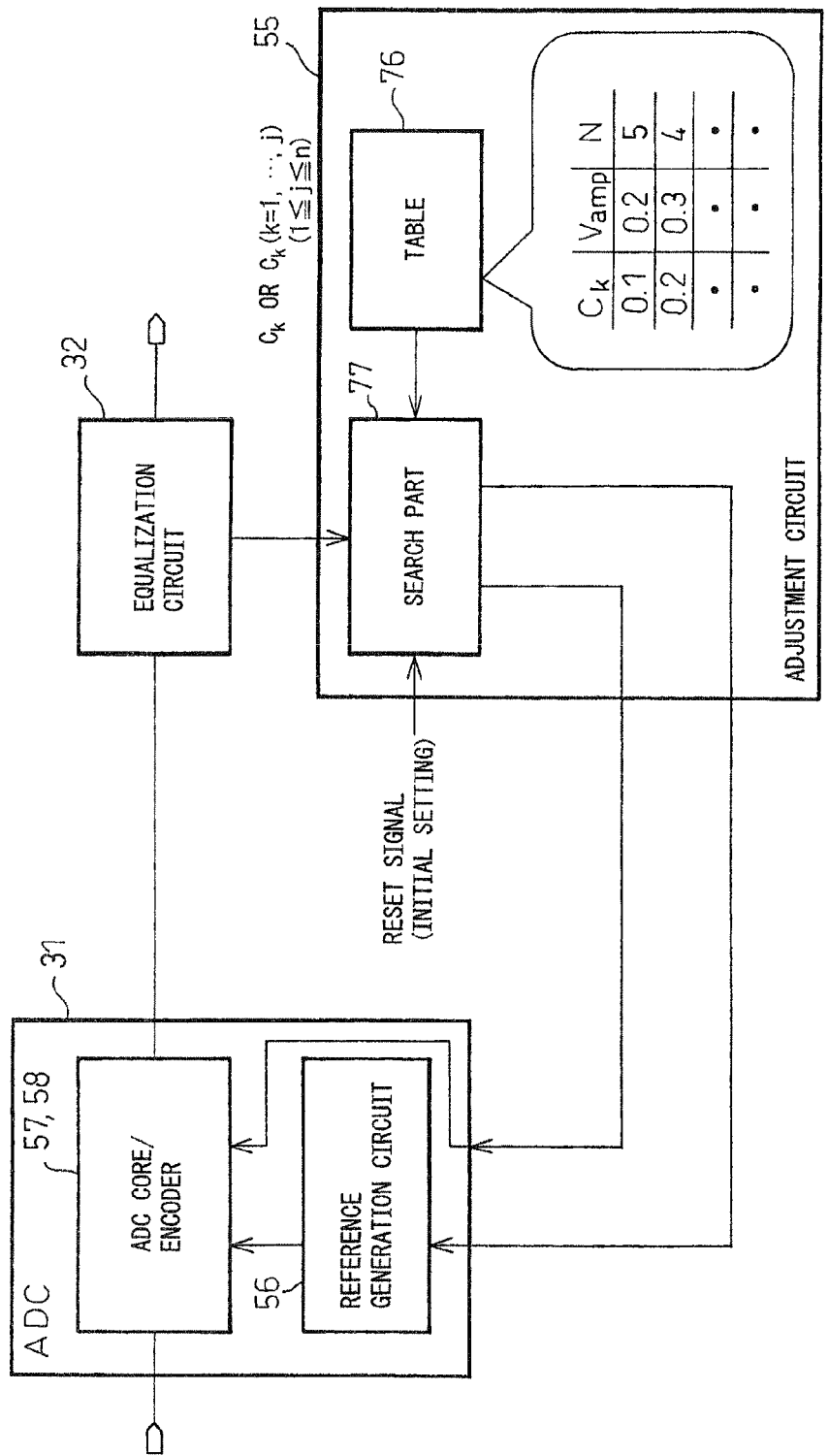
FIG. 32 is a diagram illustrating a configuration of a reception circuit in a signal transfer system in a ninth embodiment.

The signal transfer system in the ninth embodiment has the basic configuration as illustrated in FIG. 7. FIG. 32 is a block diagram illustrating a configuration of the reception circuit 3 in the eighth embodiment. In the reception circuit 3 in the eighth embodiment, the equalization circuit 32 outputs a coefficient Ck of one multiplier or a plurality of coefficients Ck (k=1, ..., j, $1 \leq j \leq n$) of a plurality of multipliers. The case of the coefficient Ck is explained as an example. The adjustment circuit 55 has a table 76 that stores an optimum relationship between the coefficient Ck and the input quantization range Vamp and the number of bits N to be validated of the reference circuit 56 of the ADC 31, which is measured in advance, and a search part 77 that searches for Vamp and N in accordance with the coefficient Ck received from the equalization circuit in the table 76 and outputs the search result to the reference circuit 56, the ADC core 57 and the encoder 58 of the ADC 31.

In the ninth embodiment, the feedback control is not performed and only the control signal Vamp and N read from the table 76 may be set to the ADC 31.

Figure 33:
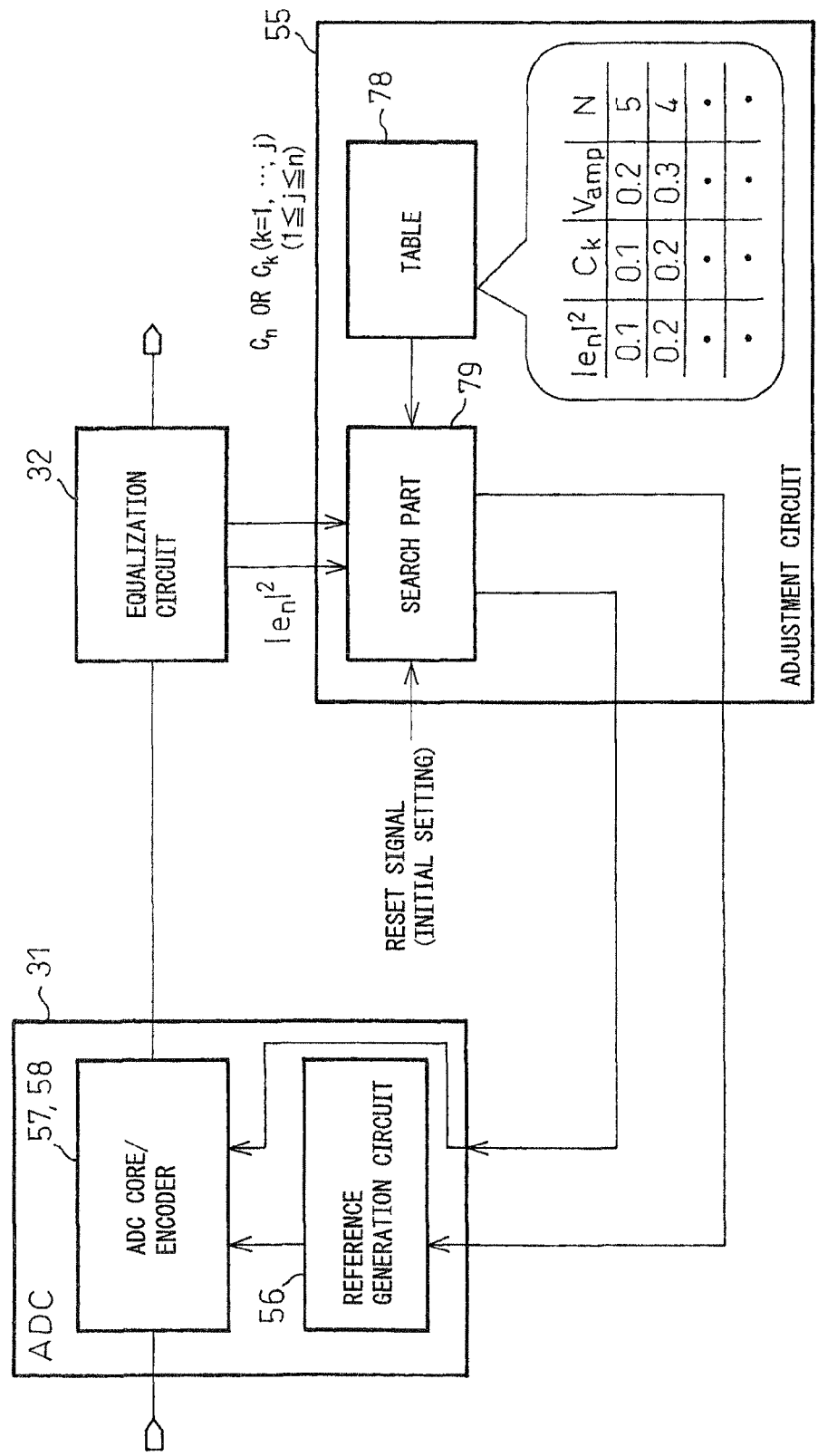
FIG. 33 is a diagram illustrating a configuration of a reception circuit in a signal transfer system in a tenth embodiment.

FIG. 33 is a block diagram illustrating a configuration of a reception circuit of a signal transfer system in a tenth embodiment. The reception circuit in the tenth embodiment resembles that in the ninth embodiment but differs in that both the error value and the coefficient of the multiplier of the equalization circuit 32 are used to evaluate the reproduction state of the received signal. Consequently, in a table 78, an optimum relationship between various combinations of the error value and the coefficient Ck and the input quantization range Vamp and the number of bits N to be validated of the reference circuit 56 of the ADC 31 is stored. The other parts are the same as those in the eighth embodiment and therefore no explanation is given.

Figure 34:
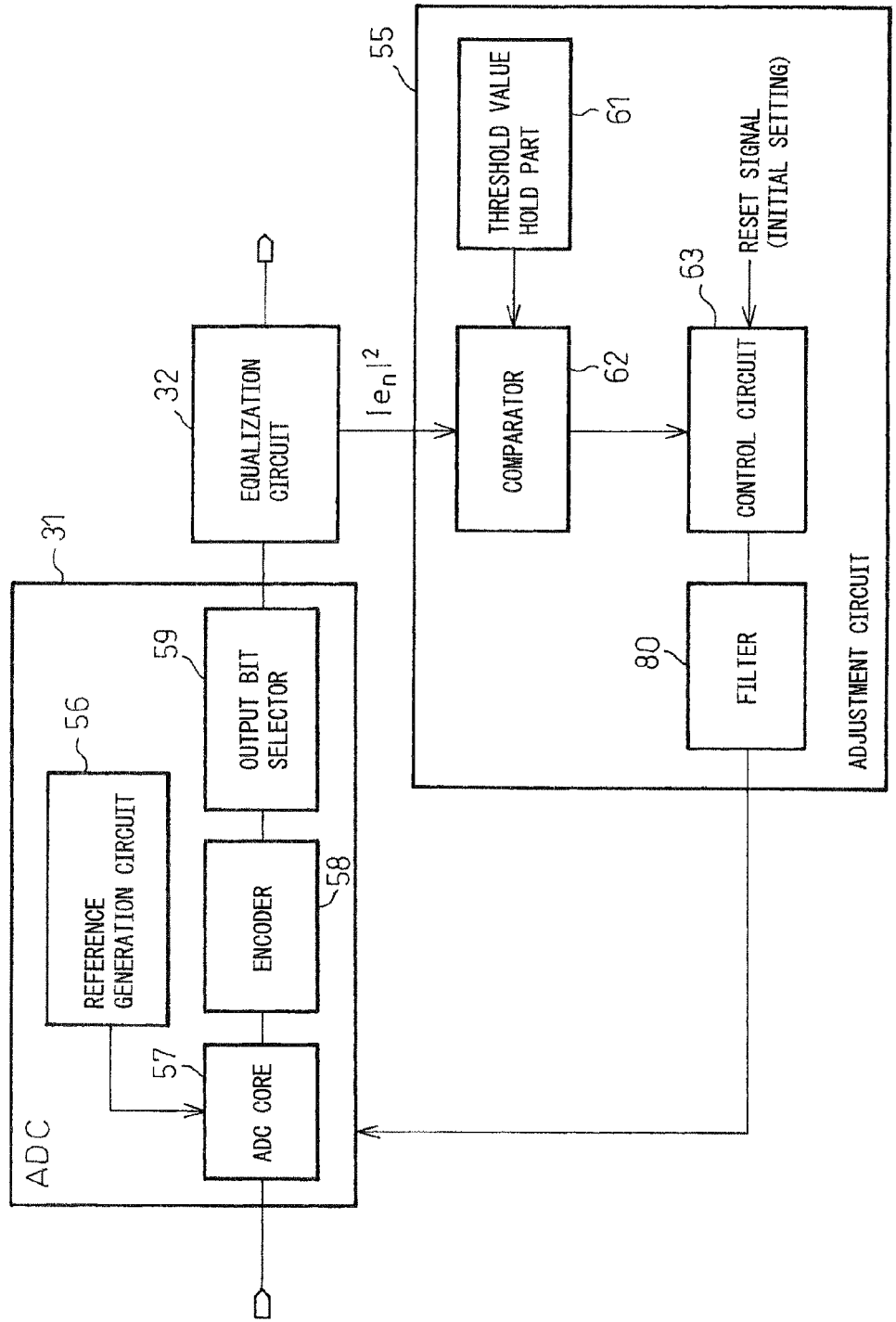
FIG. 34 is a diagram illustrating a configuration of a reception circuit in a signal transfer system in an eleventh embodiment.

FIG. 34 is a block diagram illustrating a configuration of a reception circuit of a signal transfer system in an eleventh embodiment. The reception circuit in the eleventh embodiment differs from that in the other embodiments in that a filter 80 that performs filter processing on a control signal of the control circuit 63 is provided.

As described above, even if the quantization range or the number of bits (precision) of the ADC is changed, there is a delay in time until an error value in accordance with the change is output. The filter 80 alleviates the influence of the delay in time. The filter 80 may be realized by, for example, a simple low pass filter (smoothing circuit) to suppress variations in behavior in the form of a noise, that is, variations in high frequency, or by a notch filter to suppress only a specific frequency component. In the eleventh embodiment, at least one of the quantization range and the number of bits of the ADC 31 is adjusted in a manner similar to that in the above-described embodiments.

It is also possible to obtain the same effect even if the frequency of the clock to be supplied to the ADC is reduced.

Figure 35:
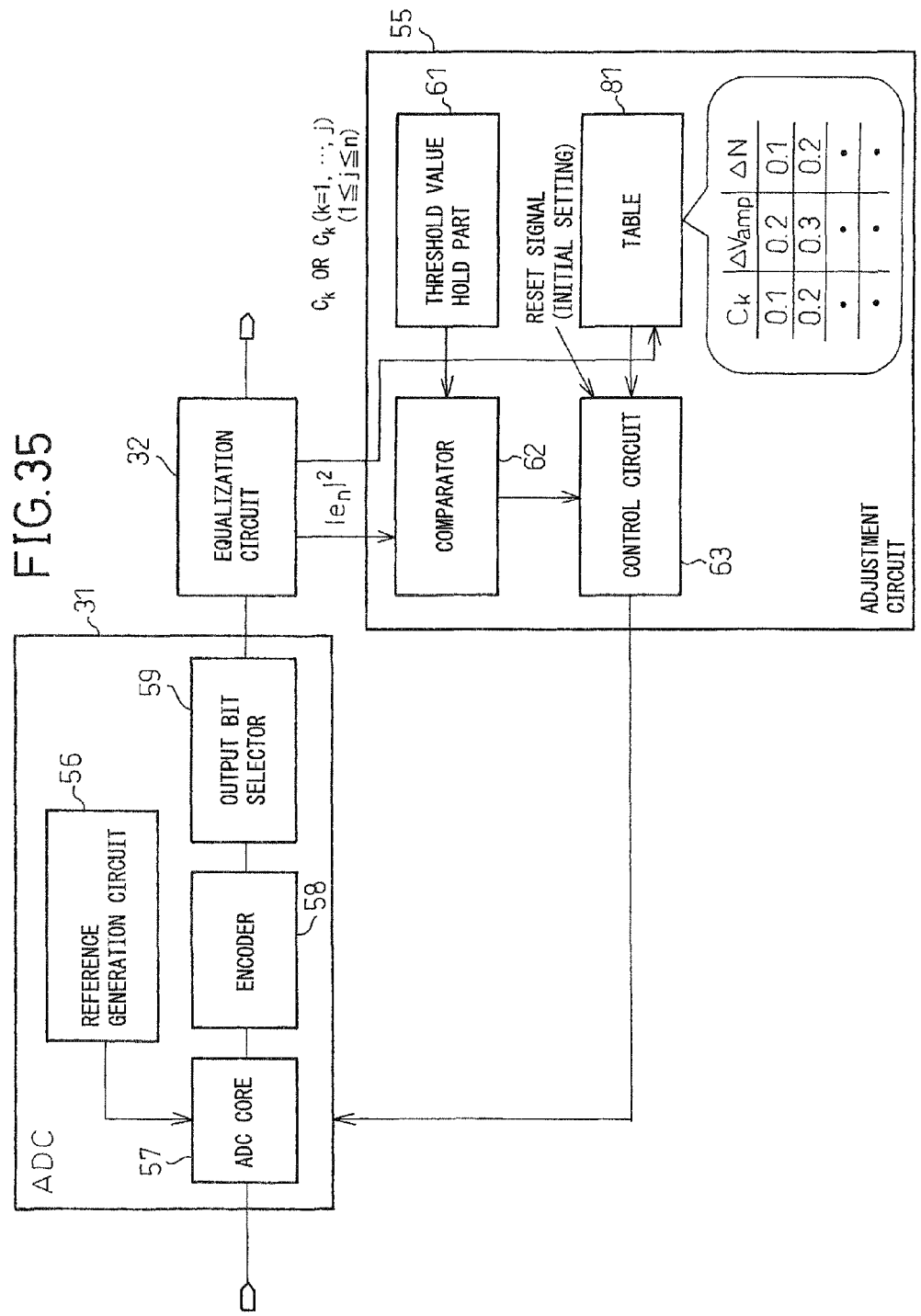
FIG. 35 is a diagram illustrating a configuration of a reception circuit in a signal transfer system in a twelfth embodiment.

FIG. 35 is a block diagram illustrating a configuration of a reception circuit of a signal transfer system in a twelfth embodiment. The reception circuit in the twelfth embodiment differs from that in the other embodiments in that the step value (adjustment step amount) of the amount of adjustment of at least one of the quantization range and the number of bits of the ADC is changed.

As in the tenth embodiment, the reception circuit in the twelfth embodiment receives an error value and the coefficient Ck (or Ck (k=1, ..., j, $1 \leq j \leq n$) from the equalization circuit 32. The coefficient Ck is loss information of the transfer line 2 and in the twelfth embodiment, the step value (adjustment step amount) of the amount of adjustment of the number of bits of the ADC is changed in accordance with the loss (i.e., the coefficient Ck). Because of this, in a table 81, the coefficient Ck and a step value ΔVamp of the quantization range and a step value ΔN of the number of bits of the ADC 31 are stored associated with each other. The table 81 outputs ΔVamp and ΔN in accordance with the coefficient Ck output from the equalization circuit 32. The control circuit 63 changes Vamp and N in a step of ΔVamp and a step of ΔN. In the twelfth embodiment, at least one of the quantization range and the number of bits of the ADC 31 is changed in a manner similar to that in the above-described embodiments.

Figure 36:
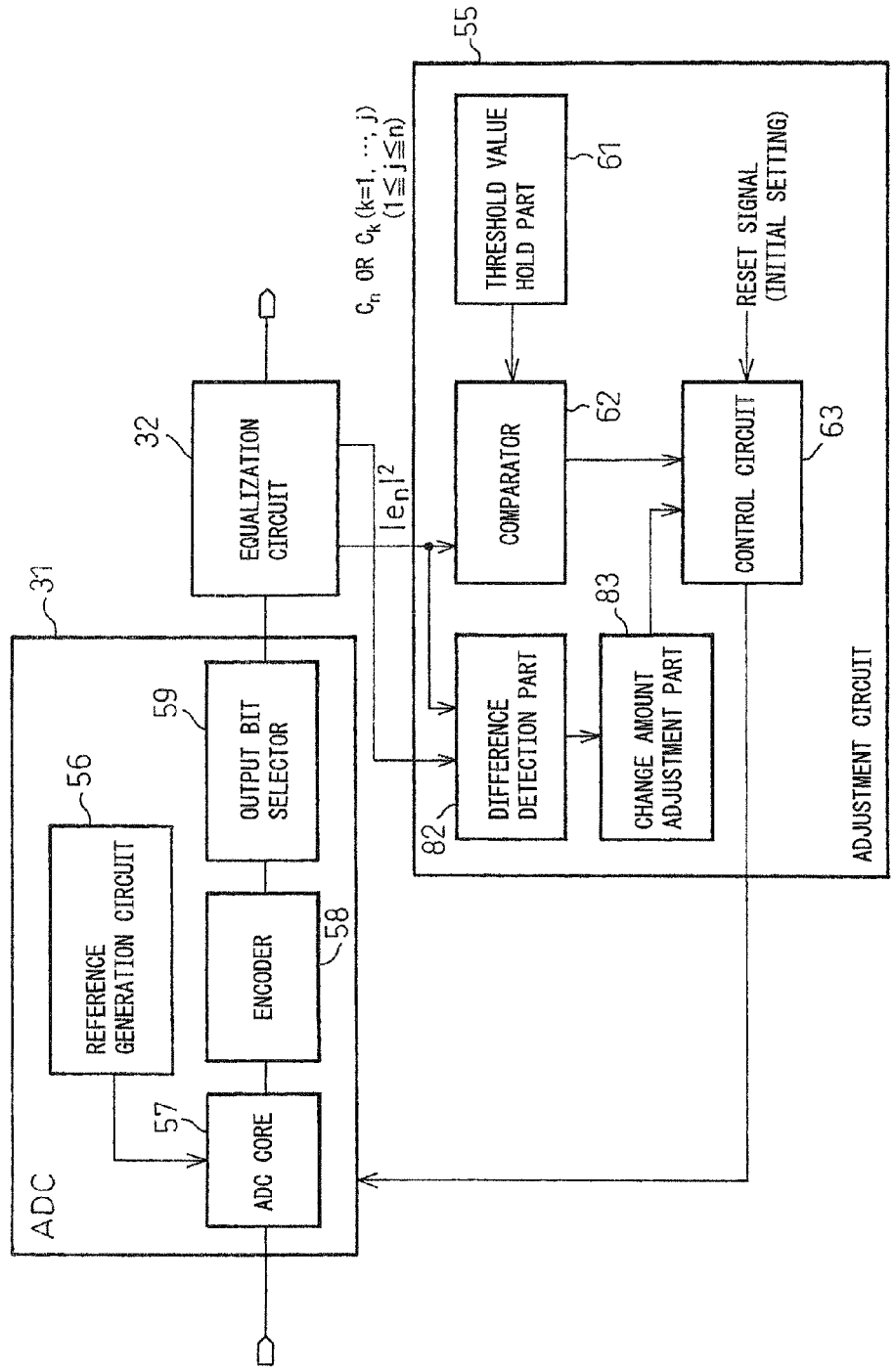
FIG. 36 is a diagram illustrating a configuration of a reception circuit in a signal transfer system in a thirteenth embodiment.

FIG. 36 is a block diagram illustrating a configuration of a reception circuit of a signal transfer system in a thirteenth embodiment. The reception circuit in the thirteenth embodiment differs from that in the other embodiments in that the step value (adjustment step amount) of the amount of adjustment of at least one of the quantization range and the number of bits of the ADC is determined from an amount of change in error value and in the coefficient Ck, and adjustment is made using the determined step value.

As in the twelfth embodiment, the reception circuit in the thirteenth embodiment receives an error value and the coefficient Ck (or Ck (k=1, . . . , j, 1≤j≤n) from the equalization circuit 32. The adjustment circuit 55 further has a difference detection part 82 that detects a change in the error value and in the coefficient Ck, and a change amount adjustment part 83 that determines an amount of step of adjustment from the change in the error value and in the coefficient Ck detected by the change amount adjustment part 83. The control circuit 63 changes Vamp and N with the amount of step determined by the change amount adjustment part 83. In the twelfth embodiment, at least one of the quantization range and the number of bits of the ADC 31 is adjusted in a manner similar to that in the above-described embodiments.

In the explanations above, it is assumed that the interval between the divided potentials corresponding to the resolution of the ADC is constant. However, in actuality, the interval is not constant and there is an error. According to the embodiments, the number of bits of the ADC is reduced in accordance with the reproduction state of a received signal. For example, when a 6-bit ADC is operated with 3 bits, an interval corresponding to seven comparators is provided and every eight comparators is made valid. If the divided potentials are not spaced regularly, the characteristics of the 3-bit ADC are not linear.

Figure 37:
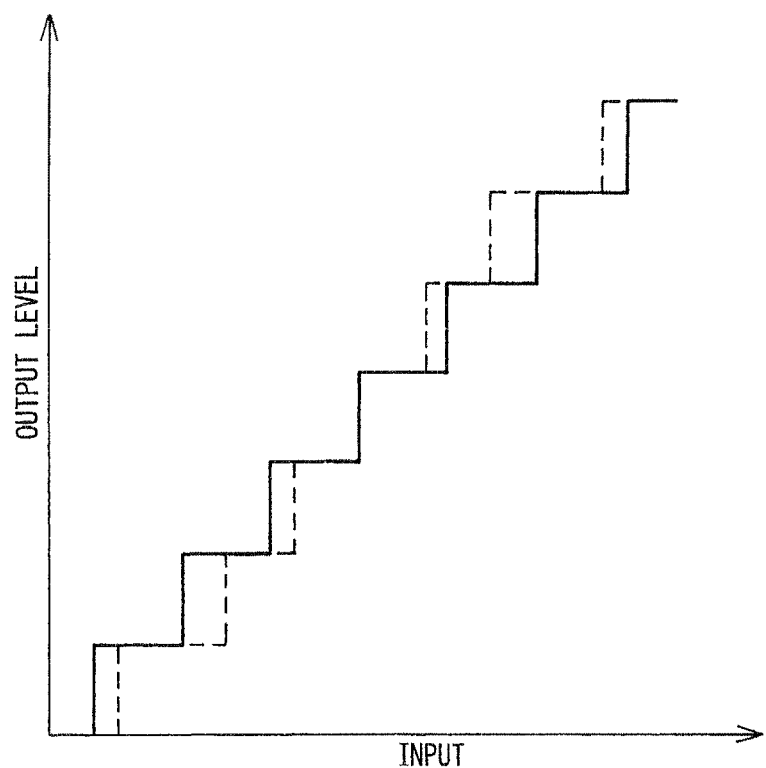
FIG. 37 is a diagram explaining an example in which valid comparators are selected at irregular intervals in a flash type ADC.

Because of this, it is possible to make the characteristics of the ADC the number of bits of which has been reduced more linear by selecting the comparators in accordance with the error of the divided potential instead of selecting the comparators to be made valid at regular intervals. FIG. 37 is a diagram explaining this. In FIG. 37, the transverse axis represents the input signal (analog signal) and the vertical axis represents the digital output level. The broken line represents an example of the characteristics of the ADC when seven intervals are formed and one of eight comparators is made valid. The solid line represents a case where comparators to be made valid are selected in accordance with the error of the divided potential so that the characteristics of the ADC are linear, instead of selecting comparators to be made valid at regular intervals.

In order to make it possible not to select comparators to be made valid at regular intervals, it may be necessary to make it possible to arbitrarily select each comparator of the ADC core, in other words, it may be necessary to provide a selection signal for each comparator. Further, in this case, it may be necessary to use the encoder in FIG. 15.

It is also possible to adjust each resistive element of the ladder resistor of the ADC so that the divided potentials are at regular intervals by making the resistance values variable as illustrated in FIG. 38A. In this case, each resistive element has a configuration in which a set of a plurality of resistor and transistors are connected in series is connected with another set in parallel as illustrated in FIG. 38B, and the number of sets to be made valid is controlled by controlling the conduction/con-conduction state of the transistors. Further, as illustrated in FIG. 38C, it is also possible to make use of a configuration in which the operation resistance of a transistor is adjusted by adjusting the gate voltage after connecting the gate of a Tr1 corresponding to the resistive element of the ladder resistor to the output of a variable voltage generation circuit configured by a D/A converter 85 and a Tr2.

In the embodiments explained above, the quantization range and the number of bits of one ADC are adjusted; however, as illustrated in FIG. 39, sub-ADCs 91 to 94 having a plurality of bits and different quantization ranges and a selector 95 that selects the output of the sub-ADCs 91 to 94 are provided in the ADC 31 and the adjustment circuit 55 selects a sub-ADC to be operated and controls the selection by the selector 95. Due to this, it is possible to adjust the quantization range and the number of bits of the ADC and the same effect as that in the above-mentioned embodiments may be obtained. There may also be a modified example, in which the quantization ranges of the sub-ADCs 91 to 94 may be adjusted by the adjustment circuit 55, respectively.

The embodiments are explained as above; however, it is obvious that there may also be various modified examples, and for example, it is also possible to combine the second to thirteenth embodiments explained above and modified examples with each another.

As described above, according to the embodiments, it is possible to appropriately set the quantization range and the precision (number of bits) of an ADC for a high-speed signal transfer 10 in accordance with the loss of a transfer line using computation results (error values and generation coefficients on the way of an equalization circuit. Due to this, the characteristics of an ADC are adjusted in accordance with the characteristics of the transfer line and excessive power consumption may be reduced.

The embodiments may be applied to any signal transfer system that uses an ADC and to any reception circuit that is used in such a signal transfer system.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment of the present invention have been described in detail, it should be understood that the various changes, substitutions, and alterations could be made hereto without departing from the spirit and scope of the invention.

What is claimed is:

1. A reception circuit, comprising:
an AD converter;
an equalization circuit that equalizes an output of the AD converter;
a determination circuit that determines a value of error information on the basis of an output of the equalization circuit; and
a controller that adjusts at least one of resolution and voltage range of the AD converter, wherein
the determination circuit outputs a control signal to adjust at least one of resolution and voltage range to the controller on the basis of comparison of the value of error information and a predetermined value.

2. The reception circuit according to claim 1, wherein:
the AD converter comprises:
a reference circuit that generates a reference potential;
a core circuit that compares an input voltage with a plurality of divided potentials obtained by dividing the reference potential and outputs a comparison result; and an encoder that encodes the comparison result; and
the controller adjusts the voltage range of the AD converter by adjusting the reference potential generated by the reference circuit on the basis of the control signal.

3. The reception circuit according to claim 1, wherein:
the AD converter comprises:
a reference circuit that generates a reference potential;
a core circuit that compares an input voltage with a plurality of divided potentials obtained by dividing the reference potential and outputs a comparison result; and
an encoder that encodes the comparison result; and
the controller adjusts the resolution of the AD converter by partially terminating the supply of a clock to a comparator and amplifier of the core circuit and clipping an output when terminating the supply of a clock.

4. The reception circuit according to claim 1, wherein:
the AD converter comprises:
a reference circuit that generates a reference potential;
a core circuit that compares an input voltage with a plurality of divided potentials obtained by dividing the reference potential and outputs a comparison result; and
an encoder that encodes the comparison result; and
the controller adjusts the resolution of the AD converter by partially terminating the supply of a clock to a comparator and an amplifier of the core circuit and clipping an input when terminating the supply of a clock.

5. The reception circuit according to claim 1, wherein:
the AD converter comprises:
a reference circuit that generates a reference potential;
a core circuit that compares an input voltage with a plurality of divided potentials obtained by dividing the reference potential and outputs a comparison result; and
an encoder that encodes the comparison result; and
the controller adjusts the resolution of the AD converter by partially terminating internal computation of the encoder.

6. The reception circuit according to claim 1, wherein:
the AD converter comprises an output bit selector that selects an output bit of the AD converter and clips a bit not to be output; and
the controller adjusts the resolution of the AD converter by controlling the number of bits to be output from the AD converter by the output bit selector.

7. The reception circuit according to claim 1, wherein:
the controller adjusts both the resolution and the voltage range of the AD converter; and
the determination circuit outputs a control signal to adjust both the resolution and the voltage range of the AD converter to the controller.

8. The reception circuit according to claim 1, wherein:
the AD converter has a plurality of sub AD converters of different numbers of bits and a selector that selects an output of the plurality of sub AD converters and outputs the output to the equalization circuit; and
the controller selectively brings the plurality of sub AD converters into an operating state and controls the selection of the selector in accordance with the selected sub AD converter.

9. The reception circuit according to claim 1, having an initialization signal input terminal that receives an initialization signal to specify an initialization period of time, wherein
the determination circuit generates the control signal based on the error information generated from a test signal having a certain pattern input during the initialization period of time.

10. The reception circuit according to claim 1, wherein
the determination circuit generates the control signal by performing feedback control so that an amount of error included in the error information is smaller than a certain threshold value.

11. The reception circuit according to claim 10, wherein:
the certain threshold value has first and second threshold values; and
the first threshold value is used when the amount of error increases at the time of adjustment and the second threshold value is used when the amount of error decreases at the time of adjustment, and the first threshold value is greater than the second threshold value.

12. The reception circuit according to claim 1, comprising a filter that varies the time characteristic to change the resolution and voltage range by the adjustment circuit.

13. The reception circuit according to claim 7, wherein
the determination circuit comprises a table that stores the resolution and voltage range suitable for the amount of error included in the error information, selects the resolution and voltage range from the table in accordance with the amount of error from the equalization circuit, and outputs a control signal to adjust the resolution and voltage range of the AD converter to the controller after setting the selected resolution and voltage range to the AD converter.

14. The reception circuit according to claim 7, wherein
the determination circuit comprises a table that stores the resolution and voltage range suitable for a coefficient of the equalization circuit and selects the resolution and voltage range from the table in accordance with the coefficient of the equalization circuit.

15. The reception circuit according to claim 7, wherein
the determination circuit comprises a table that stores the resolution and voltage range suitable for the amount of error included in the error information and the coefficient of the equalization circuit and selects the resolution and voltage range from the table in accordance with the amount of error included in the error information and the coefficient of the equalization circuit.

16. The reception circuit according to claim 7, wherein
the determination circuit comprises a table that stores an amount of adjustment step of the resolution and voltage range for a coefficient of the equalization circuit, selects the amount of adjustment step of the resolution and voltage range from the table in accordance with the coefficient of the equalization circuit, and makes an adjustment with the selected amount of adjustment step of the resolution and voltage range.

17. The reception circuit according to claim 7, wherein
the determination circuit comprises a difference detection circuit that detects a change in the amount of error included in the error information and in the coefficient of the equalization circuit, and a change amount adjustment part that determines an amount of adjustment step of the resolution and voltage range from the amount of change detected by the difference detection part, and makes an adjustment with the determined amount of adjustment step of the resolution and voltage range.

18. The reception circuit according to claim 1, wherein
the AD converter is a flash type that has a plurality of quantized cells and selects the plurality of quantized cells at irregular intervals when reducing the resolution.

19. A method of controlling a circuit having an AD converter and an equalization circuit, comprising:
making a two-value determination of an output of the AD converter on the basis of a reference value;

calculating a value of error information between a value determined by the two-value determination and the output;

comparing the calculated value of error information with a reference value; and controlling at least one of the resolution and voltage range of the AD converter on the basis of the result of the comparison.

20. A signal transfer system comprising:

a transmission circuit that transmits a signal;

a transfer line that is connected to the transmission circuit and which transfers the signal; and a reception circuit that is connected to the transfer line and which receives the transferred signal, wherein the reception circuit comprises:

an AD converter that converts the received signal into a multi-bit digital signal;

an equalization circuit that equalizes the digital signal output from the AD converter and generates information about a reproduction state indicative of the reproduction state of the received signal; and an adjustment circuit that adjusts at least one of an input quantization range and resolution of the AD converter based on the information about the reproduction state from the equalization circuit.

* * * * *